US009419116B2

(12) United States Patent
Ankoudinov

(10) Patent No.: US 9,419,116 B2
(45) Date of Patent: Aug. 16, 2016

(54) DIODES AND METHODS OF MANUFACTURING DIODES

(71) Applicant: Alexei Ankoudinov, Redmond, WA (US)

(72) Inventor: Alexei Ankoudinov, Redmond, WA (US)

(*) Notice: Subject to any disclaimer, the term of this patent is extended or adjusted under 35 U.S.C. 154(b) by 0 days.

(21) Appl. No.: 14/919,438

(22) Filed: Oct. 21, 2015

(65) Prior Publication Data

US 2016/0043204 A1  Feb. 11, 2016

Related U.S. Application Data

(63) Continuation-in-part of application No. 14/589,792, filed on Jan. 5, 2015, now Pat. No. 9,224,876, and a continuation-in-part of application No. 14/601,547, filed on Jan. 21, 2015, now Pat. No. 9,252,293.

(60) Provisional application No. 61/931,122, filed on Jan. 24, 2014, provisional application No. 61/930,278, filed on Jan. 22, 2014.

(51) Int. Cl.
| H01L 29/739 | (2006.01) |
| H01L 29/872 | (2006.01) |
| H01L 29/66 | (2006.01) |
| H01L 29/06 | (2006.01) |
| H01L 29/861 | (2006.01) |
| H01L 29/32 | (2006.01) |
| H01L 29/40 | (2006.01) |
| H01L 29/16 | (2006.01) |
| H01L 21/263 | (2006.01) |

(52) U.S. Cl.
CPC .......... *H01L 29/7391* (2013.01); *H01L 21/263* (2013.01); *H01L 29/0619* (2013.01); *H01L 29/32* (2013.01); *H01L 29/66136* (2013.01); *H01L 29/66143* (2013.01); *H01L 29/861* (2013.01); *H01L 29/8611* (2013.01); *H01L 29/872* (2013.01); *H01L 29/1608* (2013.01); *H01L 29/407* (2013.01); *H01L 29/8725* (2013.01)

(58) Field of Classification Search
None
See application file for complete search history.

(56) References Cited

U.S. PATENT DOCUMENTS

| 5,072,266 A | 12/1991 | Bulucea et al. |
| 5,365,102 A | 11/1994 | Mehrotra et al. |
| 5,541,425 A | 7/1996 | Nishihara |

(Continued)

OTHER PUBLICATIONS

A. Portst et al., Improvement of the Diode Characteristics Using Emitter-Controlled Principles (EMCON-Diode), 1997, 4 pages, Proc. ISPSD, 1997, pp. 213-217.

(Continued)

*Primary Examiner* — Joseph Schoenholtz
(74) *Attorney, Agent, or Firm* — Kolisch Hartwell, P.C.

(57) ABSTRACT

Diodes and methods of manufacturing diodes are disclosed. In some examples, the diodes may include a cathode assembly. The cathode assembly may include a cathode electrode and a N+ substrate layer on the cathode electrode. The cathode assembly may additionally include a N buffer layer on the N+ substrate layer, and a N− bulk layer on the N buffer layer. The N buffer layer may be disposed between the N+ substrate layer and the N− bulk layer. Additionally, the N buffer layer may include at least one damaged sublayer having crystal damage configured to provide recombination centers for charge carriers and at least one undamaged sublayer that excludes crystal damage. The diodes may additionally include an anode assembly adjacent to the N− bulk layer.

15 Claims, 16 Drawing Sheets

(56) References Cited

U.S. PATENT DOCUMENTS

| | | | |
|---|---|---|---|
| 5,818,084 A | 10/1998 | Williams et al. | |
| 5,866,931 A | 2/1999 | Bulucea et al. | |
| 6,031,265 A | 2/2000 | Hshieh | |
| 6,313,001 B1 | 11/2001 | Johansson et al. | |
| 6,373,097 B1 | 4/2002 | Werner | |
| 6,445,037 B1 | 9/2002 | Hshieh et al. | |
| 6,448,160 B1 | 9/2002 | Chang et al. | |
| 6,888,211 B2 | 5/2005 | Mauder et al. | |
| 8,148,748 B2 | 4/2012 | Ankoudinov et al. | |
| 8,912,623 B2 * | 12/2014 | Vobecky | H01L 29/32 257/477 |
| 9,224,876 B2 * | 12/2015 | Ankoudinov | H01L 29/861 |
| 9,252,293 B2 * | 2/2016 | Ankoudinov | H01L 29/861 |
| 2003/0062584 A1 * | 4/2003 | Takahashi | H01L 21/263 257/458 |
| 2006/0278925 A1 * | 12/2006 | Yamaguchi | H01L 29/0619 257/341 |
| 2010/0311230 A1 * | 12/2010 | Fujii | H01L 29/36 438/542 |
| 2011/0108941 A1 * | 5/2011 | Vobecky | H01L 29/32 257/477 |
| 2012/0286356 A1 | 11/2012 | Hebert et al. | |
| 2014/0070379 A1 * | 3/2014 | Ishimaru | H01L 29/36 257/655 |
| 2014/0374882 A1 * | 12/2014 | Siemieniec | H01L 21/324 257/618 |
| 2015/0050798 A1 * | 2/2015 | Kobayashi | H01L 29/7397 438/475 |

OTHER PUBLICATIONS

Shang-Hui L. Tu et al., Controlling the Characteristics of the MPS Rectifier by Variation of Area of Schottky Region, 1993, 9 pages, IEEE Transactions on Electron Devices, vol. 40, No. 7, 1993, pp. 1307-1315.

V. Rodov et al., High Injection Regime of super barrier rectifier, 2007, 6 pages, Solid State Electronics, vol. 51 (2007), pp. 714-718.

B. Jayant Baliga, Power Semiconductor Devices, 1996, 72 pages, PWS Publishing Company, Boston, MA.

V. Rodov et al., Super Barrier Rectifier—A New Generation of Power Diode, Oct. 2006, 4 pages.

Prof. Tsu-Jae King, Lecture #21, Outline, The MOS Capacitor, Electrostatics, Apr. 17, 2003, 12 pages, University of California, Berkeley, http://www-insteecs.berkeley.edu/~ee130/sp03/lecture/lecture21.pdf.

Prof. Saraswat, Thin Dielectrics for MOS Gate, Apr. 9, 2004, 46 pages, Stanford University, http://web.stanford.edu/class/ee311/NOTES/GateDielectric.pdf.

R. Siemieniec and J. Lutz, Axial Lifetime Control by Radiation Induced Centers in Fast Recovery Diodes, 2002, 7 pages, Proc. ISPS 2002, Prague, 83-90.

P. Hazdra, J. Vobecky, N. Galster, O. Humbel, T. Dalibor, A New Degree of Freedom in Diode Optimization: Arbitrary Axial Lifetime Profiles by Means of Ion Irradiation, 2000, 5 pages, 12th International Symposium on Power Semiconductor Devices & ICs Proceedings (Cat. No. 00CH37094).

Ronald Brammer, Anders Hallen, and Jan Hakansson, Simulation of Proton-Induced Local Lifetime Reduction in 10 kV Diodes, 1993, 3 pages, IEEE Trans. Electron Devices IEEE Transactions on Electron Devices 40.11, 2089-091.

J- F. Barbot, C. Blanchard, E. Ntsoenzok, J. Vernois, Defect levels in n-silicon after high energy and high does implantation of proton, 1996, 4 pages, Materials Science and Engineering, B 36, 81-84.

United States Patent and Trademark Office, Office Action for U.S. Appl. No. 14/589,792, Jul. 9, 2015, 24 pages.

United States Patent and Trademark Office, Notice of Allowance for U.S. Appl. No. 14/589,792, Aug. 18, 2015, 7 pages.

United States Patent and Trademark Office, Office Action for U.S. Appl. No. 14/601,547, Aug. 24, 2015, 7 pages.

United States Patent and Trademark Office, Notice of Allowance for U.S. Appl. No. 14/601,547, Oct. 8, 2015, 12 pages.

* cited by examiner

DIODES AND METHODS OF MANUFACTURING DIODES

CROSS-REFERENCE TO RELATED APPLICATIONS

This application is a continuation-in-part of U.S. patent application Ser. No. 14/589,792, which was filed on Jan. 5, 2015 and entitled "Fast Switching Diodes and Methods of Manufacturing Those Diodes," which claims the benefit of U.S. Provisional Patent Application Ser. No. 61/931,122, filed Jan. 24, 2014 and entitled "Diode with limited injection cathode." Additionally, this application is a continuation-in-part of U.S. patent application Ser. No. 14/601,547, which was filed on Jan. 21, 2015 and entitled "Trench Field Effect Diodes and Methods of Manufacturing Those Diodes," which claims the benefit of U.S. Provisional Patent Application Ser. No. 61/930,278, filed Jan. 22, 2014 and entitled "Trench Field Effect Diode." The complete disclosures of the above applications are hereby incorporated by reference for all purposes.

BACKGROUND OF THE DISCLOSURE

Diodes function ideally as "one-way valves" in electronic circuits, allowing current to pass unhindered in one direction and blocking current in the opposite direction. Solid-state diodes are generally constructed from semiconductor crystals with different layers of the crystal having different electrical properties. The most basic semiconductor diode is formed by adjoining two semiconductor crystals: one, called a P-type, that has been doped with atoms so that the majority of charge carriers are mobile positive holes, and the other, called an N-type, that has been doped with atoms so that the majority of charge carriers are negative electrons. This so-called "P-N junction" is connected to the rest of the circuit by attaching an anode material to the P-type semiconductor and a cathode material to the N-type semiconductor.

More complicated diodes are constructed by having one or more layers of N-type semiconductor and/or one or more layers of P-type semiconductor, with different layers having different amounts of mobile charge carriers. In the case of a Schottky diode, the P-type material is omitted entirely with the anode connected directly to the N-type semiconductor. The physical geometry of the diode can also be adjusted, from a simple stack of the various layers to much more complicated arrangements. Examples of diodes are disclosed in U.S. Pat. Nos. 5,072,266; 5,365,102; 5,541,425; 5,818,084; 5,866,931; 6,031,265; 6,445,037; 6,448,160; 6,888,211; 8,148,748; and 8,912,623; and U.S. Patent Application Publication Nos. 2003/0062584; 2006/0278925; 2010/0311230; 2011/0108941; 2012/0286356; 2014/0070379; 2014/0374882; and 2015/0050798. The complete disclosure of the above patents and patent application publications are hereby incorporated by reference for all purposes.

An ideal diode serves three distinct functions. First, allow current to flow from the anode side to the cathode side with no drop in potential, and hence no loss of electrical energy. When current is flowing in this direction, the diode is said to be in the "forward biased state." Second, completely block all current flowing in the opposite direction regardless of the applied voltage, which is called the "reverse biased voltage." Third, instantaneously switch between the first two functions, that is, immediately transition between the forward "on" state of allowing current to flow, and the reverse "off" state of blocking all current. This transition is called "commutation," "recovery," or "reverse recovery."

However, real diodes do not function ideally. First, there is usually some small drop in potential when the diode is in the forward biased state. That is, there is some unwanted resistance to the free flow of current in the forward biased state, called "parasitic resistance." Depending on the intended application of the diode, the losses due to the parasitic resistance may be large and may adversely affect components downstream from the diode.

Second, the diode allows a nonzero leakage current to flow in the reverse biased state and this leakage current increases as the reverse biased voltage increases. The small current that flows in the opposite direction during reverse bias is called a "leakage current" and often increases as the reverse bias voltage increases. Eventually, the leakage current increases dramatically when the reverse bias voltage reaches some rated breakdown voltage. Diodes with a leakage current that does not increase with increasing reverse bias voltage are referred to as having a "flat leakage current."

Third, a real diode takes time to switch between the on state and the off state. When conducting, the diode is flooded with electrons and holes moving in opposite directions. In order for the diode to transition to the off state, this excess "stored charge" needs to be removed from the diode during what is called the "reverse recovery time."

SUMMARY OF THE DISCLOSURE

Some embodiments provide a diode. In some examples, the diode may include a cathode assembly. The cathode assembly may include a cathode electrode and a N+ substrate layer on the cathode electrode. The cathode assembly may additionally include a N buffer layer on the N+ substrate layer, and a N− bulk layer on the N buffer layer. The N buffer layer may be disposed between the N+ substrate layer and the N− bulk layer. Additionally, the N buffer layer may include at least one damaged sublayer having crystal damage configured to provide recombination centers for charge carriers and at least one undamaged sublayer. The diode may additionally include an anode assembly adjacent to the N− bulk layer.

In some examples, the diode may include a cathode assembly. The cathode assembly may include a cathode electrode and a N+ substrate layer on the cathode electrode. The cathode assembly may additionally include a N buffer layer on the N+ substrate layer, and a N− bulk layer on the N buffer layer. The N buffer layer may be disposed between the N+ substrate layer and the N− bulk layer. Additionally, the N buffer layer may include crystal damage configured to provide recombination centers for charge carriers. The diode may additionally include an anode assembly adjacent to the N− bulk layer. The anode assembly may include an anode electrode with at least one trench. The at least one trench may include first and second sides and a bottom. The first and second sides may include first and second insulating layers.

In some examples, the diode may include a cathode assembly. The cathode assembly may include a cathode electrode and a N+ substrate layer on the cathode electrode. The cathode assembly may additionally include a N buffer layer on the N+ substrate layer, and a N− bulk layer on the N buffer layer. The N buffer layer may be disposed between the N+ substrate layer and the N− bulk layer. Additionally, the N buffer layer may include crystal damage configured to provide recombination centers for charge carriers. The diode may additionally include an anode assembly. The anode assembly may include an anode electrode and a gate electrode layer under the anode electrode. The gate electrode layer may be shorted to the anode electrode. The anode assembly may additionally include a gate oxide layer under the gate electrode layer, and at least one P− body region under the gate oxide layer. The anode assembly may further include at least one trench that extends through the gate electrode layer, the gate oxide layer, and the at least one P− body region to the N− bulk layer. The at least one trench may include an upper portion and a lower portion. The lower portion may have a bottom and a plurality of sidewalls defining a bottom volume. The bottom and the plurality of sidewalls may have an insulating layer. The lower portion may further have a conductive material that is disposed within the bottom volume and that is in electrical communication with the anode electrode. The insulating layer may be configured to electrically insulate the conductive material from the N− bulk layer. The anode electrode may extend through the upper portion of the at least one trench to the conductive material.

DETAILED DESCRIPTION OF THE DISCLOSURE

Figure 1:
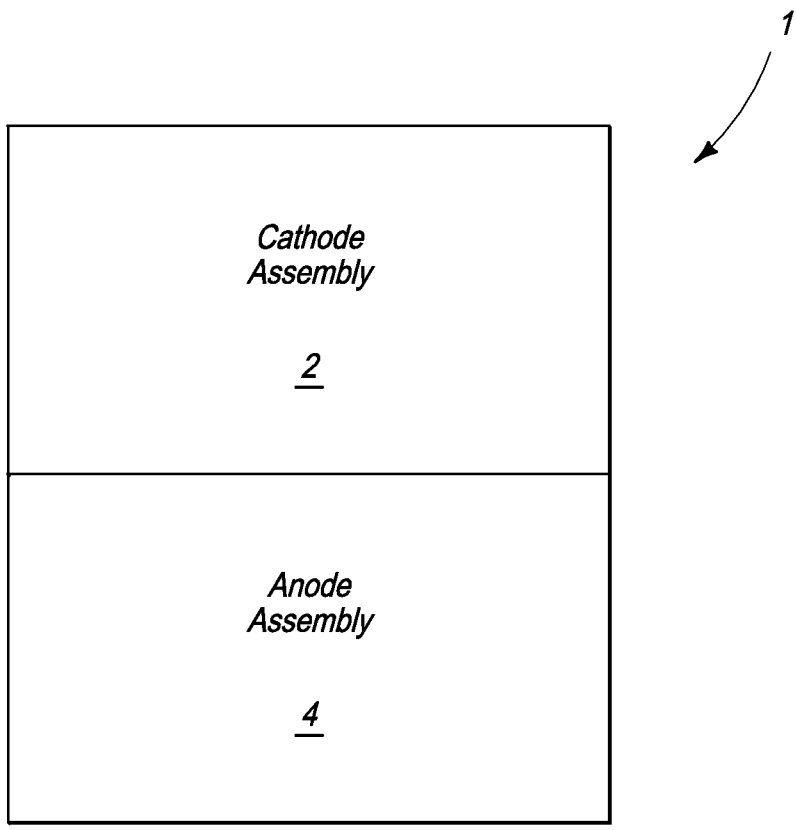
FIG. 1 is a schematic view of an example of a diode.

FIG. 1 is a schematic view of an example of a diode 1. Diode 1 may include any suitable structure configured to allow current to pass unhindered in one direction and to block current in the opposite direction. For example, diode 1 may include a cathode assembly 2 and an anode assembly 4. Various examples of structures for cathode assembly 2 and/or anode assembly 4 are provided below. Although only certain combinations may be described below, the present disclosure includes all possible combinations of cathode assemblies and anode assemblies, and all possible combination of one or more components of cathode assemblies and one or more components of anode assemblies.

Figure 2:
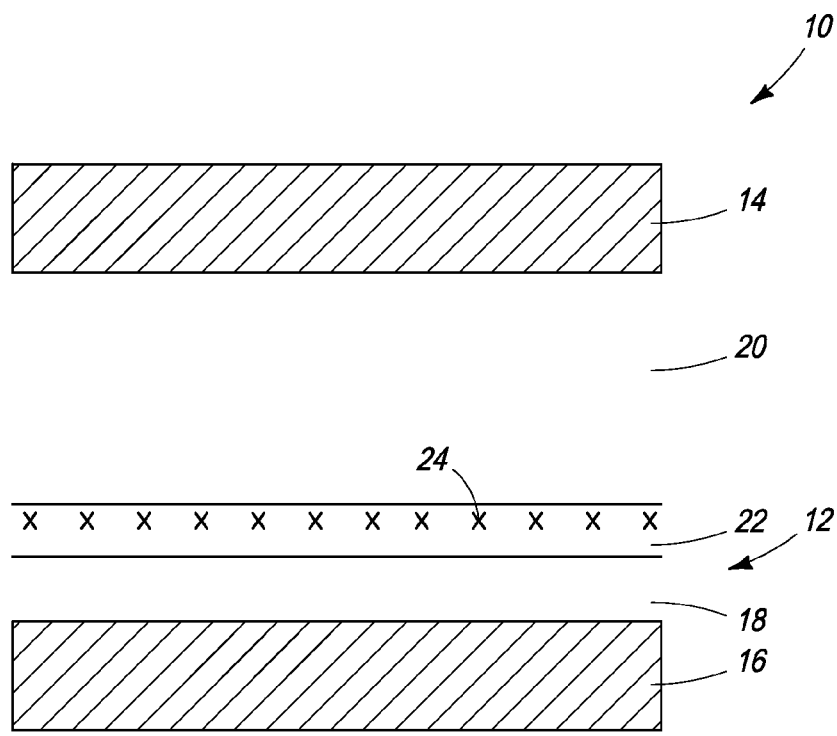
FIG. 2 is a schematic sectional view of another example of the diode of FIG. 1.

FIG. 2 is a schematic sectional view of an example of diode 1, which is generally indicated at 10. Diode 10 may include any suitable structure, such as structure configured to provide fast switching times at high applied voltages (such as having reverse recovery times of 200 nanoseconds or less at applied voltages of above 200 volts). For example, diode 10 may include a cathode assembly 12 and an anode assembly 14. The cathode assembly may include a cathode electrode (or cathode electrode layer) 16, a N+ substrate layer 18, a N− bulk layer 20, and a N buffer layer 22.

Cathode electrode 16 may be made of any appropriate metal(s). The cathode electrode may be configured to make ohmic contact with the N+ substrate layer on one side and electrical contact with a circuit on the other.

N+ substrate layer 18 may be on or over (or adjacent to) the cathode electrode. The N+ substrate layer may be a N-type semiconductor, which may be formed from a crystal, such as silicon, silicon carbide, and/or any other appropriate semiconductor(s) doped so that the majority charge carriers are electrons. The "+" after "N" in "N+ substrate layer" indicates that the layer may have a higher concentration of doping atoms than, for example, N− bulk layer 20 and/or N buffer layer 22. In some examples, the concentration of doping atoms may be above $10^{19}$ atoms per cubic centimeter. The N+ substrate layer may make ohmic contact with the cathode electrode layer 16. N+ substrate layer 18 may be configured to allow electrons to pass from the cathode electrode layer into N buffer layer 22 when a forward voltage is applied.

N− bulk layer 20 may be over or on (or adjacent to) N buffer layer 22. The N− bulk layer may be an N-type semiconductor, which may be formed from a crystal, such as silicon, silicon carbide, and/or any other appropriate semiconductor(s) doped so that the majority charge carriers are electrons. The "−" after "N" in "N− bulk layer" indicates that the layer may have a lower concentration of doping atoms than, for example, the N+ substrate layer and/or the N buffer layer. In some examples, the concentration of doping atoms may be between about $3 \times 10^{13}$ and about $6 \times 10^{14}$ atoms per cubic centimeter.

N buffer layer 22 may be over or on (or adjacent to) the N+ substrate layer and/or may be disposed between the N+ substrate layer and the N− bulk layer. The N buffer layer may be a N-type semiconductor, which may be formed from a crystal, such as silicon, silicon carbide, and/or any other appropriate semiconductor(s) doped so that the majority charge carriers are electrons. The lack of "+" or "−" after "N" in "N buffer layer" indicates that the layer may have a higher concentration of doping atoms than, for example, the N− bulk layer and/or may have a lower concentration of doping atoms than, for example, the N+ substrate layer. In some examples, N buffer layer 22 may have crystal damage 24 configured to limit injection of charge carriers, such as from the N+ substrate layer into the N− bulk layer.

"Crystal damage," as used in the present disclosure, may include (1) unoccupied lattice points in the crystal where one of the intrinsic semiconductor atoms or one of the dopant atoms is missing from its location in the crystal (e.g., because the atom was dislodged or permanently displaced by an incoming ion); (2) interstitials in the crystal where a dislodged atom or an ion has come to rest in the crystal in a location between adjacent lattice points; (3) where an incoming ion has replaced one of the intrinsic atoms of the semiconductor or one of the dopant atoms in the crystal lattice, and/or (4) other form(s) of crystal damage that change the physical, chemical, and/or electrical properties of the crystal as compared to a corresponding crystal that lacks crystal damage.

The crystal damage in the N buffer layer may limit injection of charge carriers by, for example, providing recombination centers for the electrons. In some examples, N buffer layer 22 may be the only layer in the cathode assembly that includes crystal damage. The concentration of doping atoms may, for example, be between about $3\times10^{16}$ and about $3\times10^{17}$ atoms per cubic centimeter and/or may be in between the doping levels of the N+ substrate layer and/or the N− bulk layer. In some examples, the thickness of the N buffer layer may be between about 1 and about 20 microns.

Anode assembly 14 may have a variety of configurations and components. Illustrative anode assemblies are described in reference to and shown in FIGS. 4-6. However, anode assembly 14 may include configurations and/or components in addition to, and/or instead of, the anode assemblies shown in FIGS. 4-6, such as the anode assemblies described in other parts of the present disclosure. The anode assembly may make ohmic contact with N− bulk layer 20 on one side and with an electrical circuit on the other side.

Figure 3:
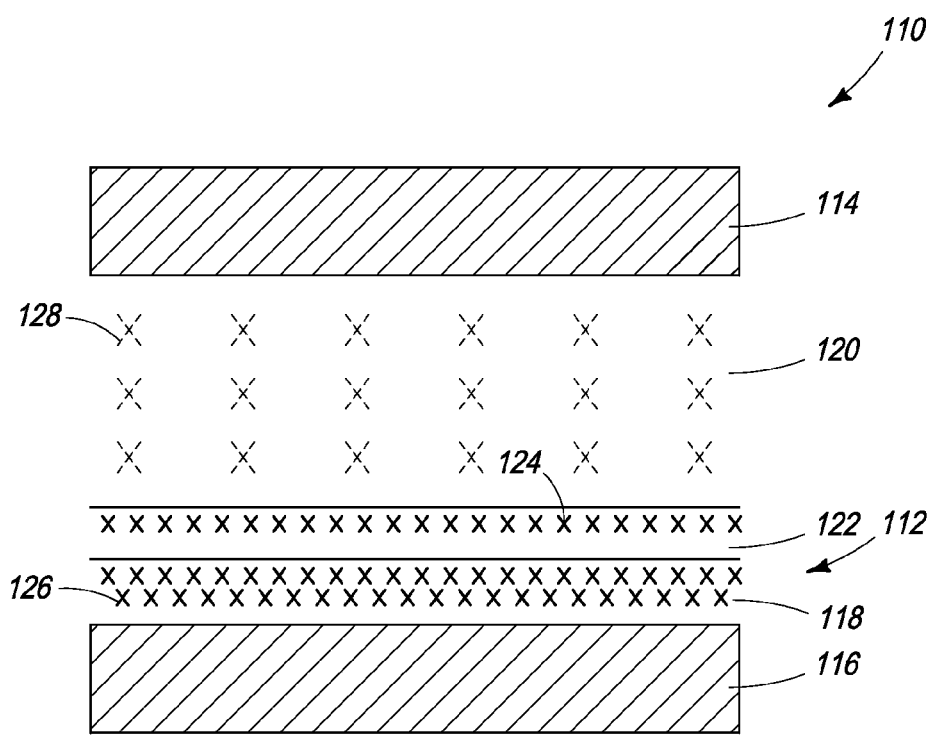
FIG. 3 is a schematic sectional view of a further example of the diode of FIG. 1.

FIG. 3 is a schematic sectional view of another example of diode 1, which is generally indicated at 110. The numbered elements of diode 110 may correspond to similarly numbered elements of diode 10 in FIG. 2. Diode 110 may include a cathode assembly 112 and an anode assembly 114. The cathode assembly may include a cathode electrode (or cathode electrode layer) 116, a N+ substrate layer 118, a N− bulk layer 120, and a N buffer layer 122.

In addition to, or instead of, crystal damage 124 indicated in the N buffer layer 122, there may be crystal damage 126 in N+ substrate layer 118. Crystal damage 126 may be configured to limit the injection of charge carriers, such as by providing recombination centers for charge carriers. The levels of crystal damage in layers 118 and 122 need not be the same, and the levels of crystal damage in layers 122 and 22 need not be the same. In some examples, the amount or extent of crystal damage 124 required in N buffer layer 122 to control the injection of charge carriers may be less with both layers 118 and 122 including crystal damage than if the crystal damage is present only in N buffer layer 22.

In some examples, N− bulk layer 120 may include crystal damage 128, which may be configured to limit the injection of charge carriers, such as by providing recombination centers for charge carriers. The level of crystal damage in the N− bulk layer generally will be less than the level of crystal damage in the N buffer layer and the N+ substrate layer. In some examples, the level of crystal damage may be measured by the density of recombination centers provided by the crystal damage, as measured in units of recombination centers per unit volume, as compared or relative to the density of recombination centers provided by crystal damage in one or more other layers. The concentration of doping atoms in the layers of diode 110 may be less, more, and/or the same as the concentration of doping atoms in the corresponding layers of diode 10.

The cathode assembly may include any suitable combination of layers with crystal damage configured to limit the injection of charge carriers. For example, in some examples, only the N buffer layer may include the crystal damage. In other examples, only the N− bulk layer and the N buffer layer include the crystal damage. Other combinations are possible and are included in the present disclosure.

Figure 4:
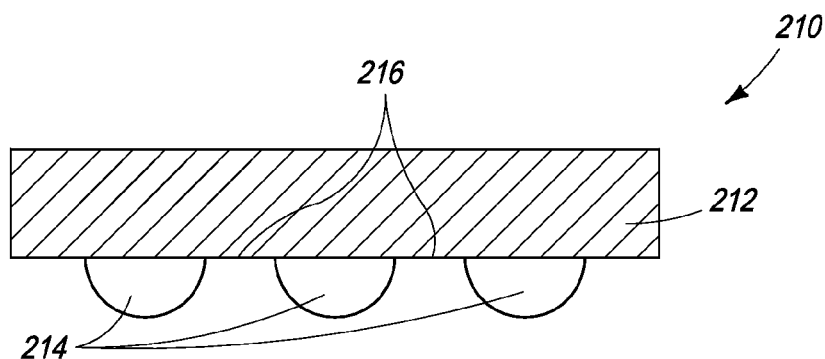
FIG. 4 is a schematic sectional view of an example of an anode assembly of the diode of FIG. 1.

FIG. 4 is a schematic sectional view of an example of anode assembly 4 of diode 1, which is generally indicated at 210. Anode assembly 210 may sometimes be referred to having a "merged P-N, Schottky (MPS) structure." The anode assembly may be connected to a N− bulk layer, such as N− bulk layer 20 or 120, and may include an anode electrode 212 and P+ regions 214.

Anode electrode 212 may be made of any appropriate metal, and may be configured to alternately make ohmic contact with P+ regions 214 and with the N− bulk layer in Schottky regions 216 on one side and with the anode electrode and electrical contact with a circuit on the other.

P+ regions 214 may be under or on (or adjacent to) the anode electrode. The P+ regions may be composed of a P-type semiconductor, which may be formed from a crystal, such as silicon, silicon carbide, and/or any other appropriate semiconductor(s) doped so that the majority charge carriers are holes. A P-N junction may be formed where P+ regions contact the N− bulk layer. In some examples, the P+ regions may have a concentration of doping atoms between about $1\times10^{18}$ and about $3\times10^{18}$ atoms per cubic centimeter. The distance between adjacent P+ regions may, for example, be between about one half and about five microns. The width of the P+ regions may, for example, be about the same as the distance between them. In some examples, the fraction of the surface of anode electrode 212 that is covered by the P+ regions may vary between about 0.3 to about 0.7 of the surface of the anode electrode (e.g., about 30% to about 70% of the anode electrode surface). By varying the fraction of the surface covered by the P+ regions, it may be possible to control the injection of charge carriers from the anode electrode.

The N− bulk layer may make contact with anode electrode 212 in Schottky regions 216 and may form a P-N junction with P+ regions 214. Thus, when anode assembly 210 is used in diode 10 or 110, the diode may be a combination of a P-N junction diode and a Schottky diode, which may sometimes be referred to as a "merged P-N Schottky (MPS) diode." MPS diodes may have the advantage of low forward voltage drops and fast switching times because of the Schottky regions and high blocking voltages because of the P-N junction regions. By adding in the N buffer layer with crystal damage to control the injection of charge carriers from the cathode side, the switching time of a MPS diode may be improved. On the anode side, the charge carriers may be injected from only P+ regions 214 and not Schottky regions 216, which limits the injection of charge carriers into the N− bulk layer and improves switching time.

Figure 5:
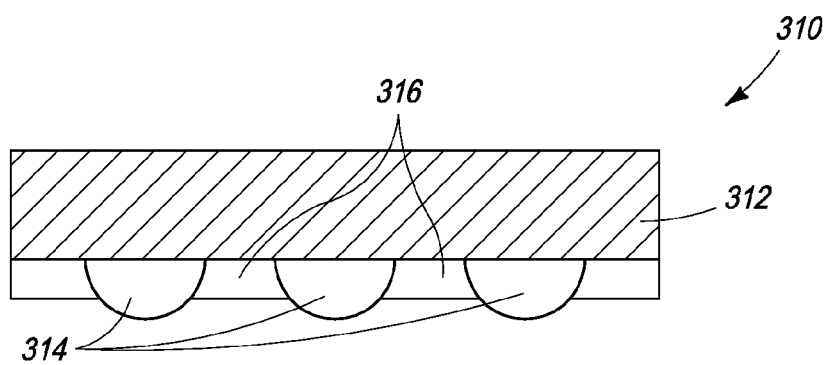
FIG. 5 is a schematic sectional view of another example of an anode assembly of the diode of FIG. 1.

FIG. 5 is a schematic sectional view of another example of anode assembly 4, which is generally indicated at 310. Anode assembly 310 may sometimes be referred to as having a "modified MPS structure." Anode assembly 310 may be connected to a N− bulk layer, such as N− bulk layer 20 or 120, and may include an anode electrode 312, one or more P+ regions 314, and one or more P regions (or P layer) 316.

Anode electrode 312 and P+ regions 314 may be the same as anode electrode 212 and P+ regions 214 of anode assembly 210. P regions 316 may be under or on (or adjacent to) the anode electrode. The P regions may be composed of a P-type semiconductor, which may be formed from a crystal, such as silicon, silicon carbide, and/or any other appropriate semiconductor(s) doped so that the majority charge carriers are holes. In some examples, the concentration of doping atoms in the P regions may be about $1\times10^{17}$ atoms per cubic centimeter. As shown in FIG. 5, the P regions may partially fill the space between adjacent P+ regions while still allowing the P+ regions to make contact with N− bulk layers 20 or 120. By controlling the doping levels of the P regions and the P+ regions, the injection of charge carriers into the N− bulk region may be controlled when the diode is in the forward biased state.

Figure 6:
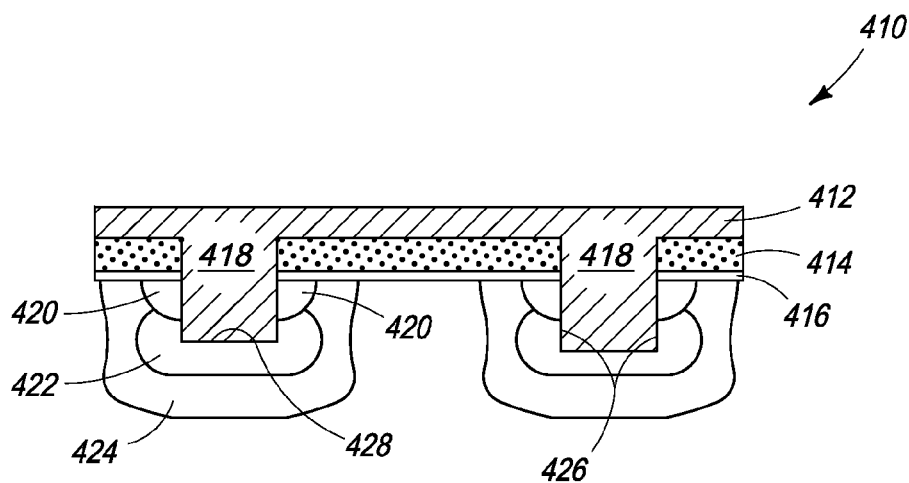
FIG. 6 is a schematic sectional view of a further example of an anode assembly of the diode of FIG. 1.

FIG. 6 is a schematic sectional view of an example of anode assembly 4, which is generally indicated at 410. Anode assembly 410 may sometimes be referred to as having a "pseudo-Schottky structure." Anode assembly 410 may be connected to a N− bulk layer, such as N− bulk layer 20 or 120.

Anode assembly 410 may include an anode electrode (or anode electrode layer) 412, a gate electrode layer 414, and a gate oxide layer 416. The anode electrode may include one or more trenches 418 that protrude through the gate electrode layer and/or the gate oxide layer. In some examples, anode assembly 410 may include a N+ anode contact 420, a P+ anode contact 422, and/or a P body region 424 for trench(es) 418 (and in some examples, for each trench 418). N+ anode contact 420 may make ohmic contact with gate oxide layer 416 and with a vertical side 426 of their associated trench 418, which may partially (but not completely) cover the surface of the trench that protrudes through the gate oxide layer. P+ anode contact 422 may be disposed under a protruding end 428 of its associated trench, making ohmic contact with the trench and N+ anode contact 420. P body region 424 may be disposed around the N+ and P+ anode contacts and in contact with gate oxide layer 416. As mentioned above, anode assembly 410 may be in contact with a N− bulk layer, such as N− bulk layer 20 or 120. By disposing the P body region around the N+ and P+ anode contacts, the N− bulk layer may make contact with only the P body region and gate oxide layer 416.

Anode electrode 412 may be made of any appropriate metal, and may be configured to make ohmic contact with the N+ and P+ anode contacts along with the gate electrode and gate oxide layers. The anode electrode also may make electrical contact with a circuit (not shown).

Gate electrode layer 414 may be under or on (or adjacent to) anode electrode 412, and may be constructed from a highly doped N-type polysilicon or one or more suitable metals with appropriate work function. In some examples, gate electrode layer 414 may have a thickness of about 600 to about 1200 angstroms.

Gate oxide layer 416 may be under or on (or adjacent to) gate electrode layer 414. The gate oxide layer may be an insulating layer composed of silicon dioxide, silicon oxynitride, and/or any other suitable dielectric material(s). Gate oxide layer 416 may have a thickness of about 30 to about 200 angstroms.

N+ anode contact 420 and P+ anode contact 422 may have been doped at levels suitable for making ohmic contact with the metal of their associated trench, which may be referred to as a protruding piece of anode electrode 412. For example, the N+ anode contact may be doped at a concentration of more than about $1 \times 10^{19}$ atoms per cubic centimeter and the P+ anode contact at a concentration of more than about $1 \times 10^{18}$ atoms per cubic centimeter. The plus sign after "N" and "P" in "N+ anode contact" and "P+ anode contact" refers to the relatively high level of doping, and the "N" and "P" indicate that the majority charge carriers in the two materials are electrons and holes, respectively. In some examples, trench(es) 418 may protrude downward through the gate electrode layer, the gate oxide layer, and the N+ anode contact but not through the P+ anode contact.

P body region 424 may be composed of a P-type semiconductor, which may be formed from a crystal, such as silicon, silicon carbide, and/or any other appropriate semiconductor(s) doped so that the majority charge carriers are holes. In some examples, P body region 424 may have a concentration of doping atoms that is less than the concentration of doping atoms in P+ anode contact 422 but still sufficient to prevent a "punch-through" of the electric field.

Figures 7, 8:
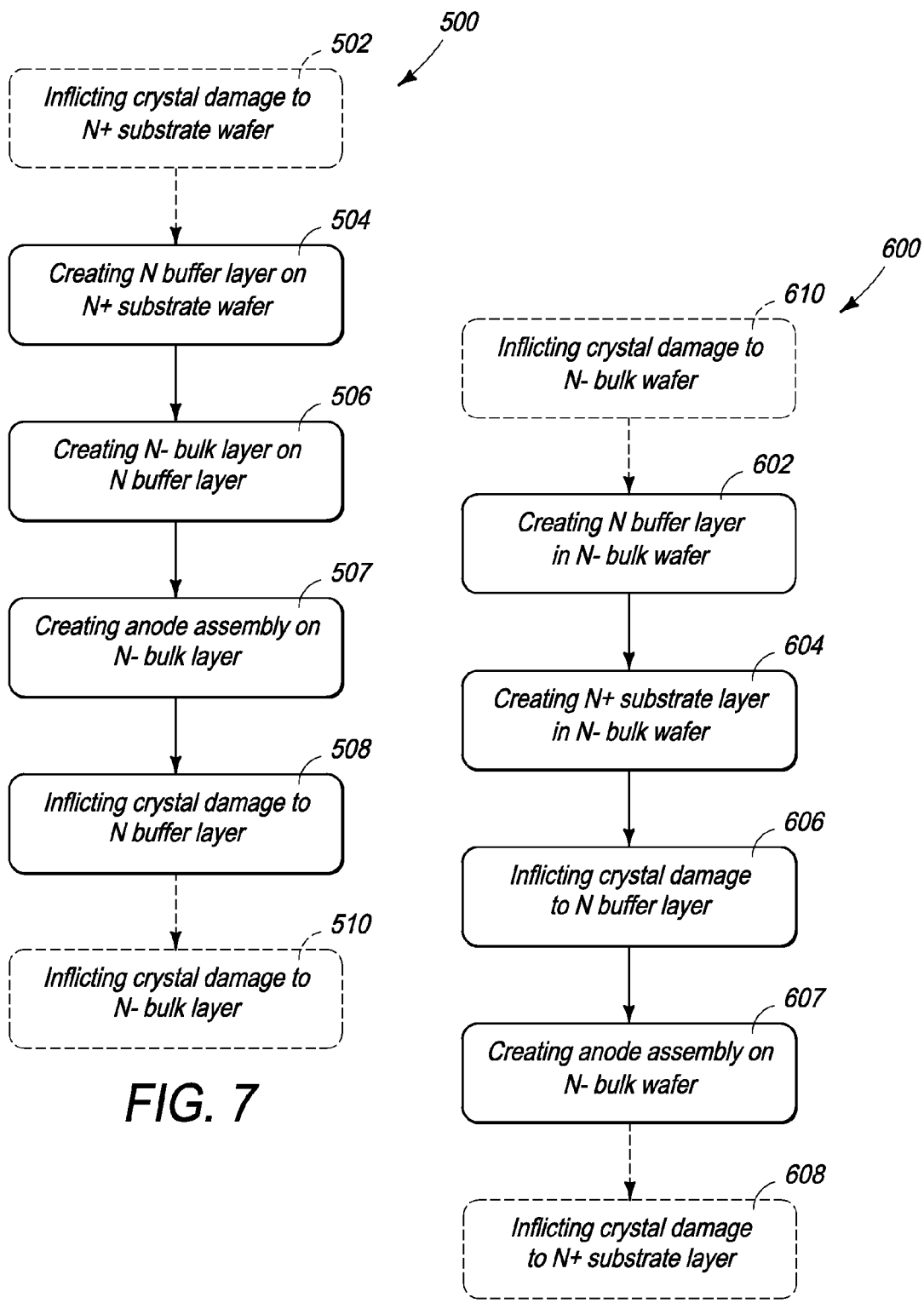
FIG. 7 is a flow chart of an example of a method of manufacturing a diode.
FIG. 8 is a flow chart of another example of a method of manufacturing a diode.

FIG. 7 is a flow chart showing an example of a method of manufacturing a diode (such as diode 10 or diode 110), which is generally indicated at 500.

At 504, a N buffer layer may be created on a N+ substrate wafer. The N+ substrate wafer may be created via the Czochralski method and/or any suitable method(s). The N buffer layer may, for example, be deposited via epitaxial growth on the N+ substrate layer. Alternatively, the N buffer layer may be created by first epitaxially growing a layer of semiconductor material on the N+ substrate wafer and then implanting the layer of semiconductor material with dopant atoms of the desired concentration.

At 506, a N− bulk layer may be created on the N buffer layer. The N− bulk layer may be deposited via epitaxial growth on the N buffer layer. At 507, an anode assembly may be created on or on top of the N− bulk layer. At 508, crystal damage may be inflicted to the N buffer layer. The crystal damage may be configured to provide recombination centers for charge carriers. The crystal damage may be inflicted by irradiating the N buffer layer with ions. The ions may be helium ions, hydrogen ions, and/or any other ions that can inflict the required crystal damage. The crystal damage may be inflicted in any suitable portion(s) within the N buffer layer, such as in one or more damaged sublayers, but not inflicted in other suitable portions within the N buffer layer, such as in one or more undamaged sublayers.

In some examples, method 500 may include step 502. At 502, crystal damage may be inflicted to the N+ substrate wafer. The crystal damage may be configured to provide recombination centers for charge carriers. In some examples, one or more irradiation techniques may be used to create well-localized traps and/or voids. The position and depth of the crystal damage caused may be controlled by varying the irradiation energy and the type of ions used. The crystal damage may be inflicted in any suitable portion(s) within the N+ substrate wafer, such as in one or more damaged sublayers, but not inflicted in other suitable portions within the N+ substrate wafer, such as in one or more undamaged sublayers. After the crystal damage is made the surface of the N+ substrate may be annealed. This annealing may be in preparation for an epitaxial growth stage to follow. The crystal damage buried underneath this annealing may remain throughout one or more other steps of method 500. However, if step 502 is not performed, then there may be no need to anneal the surface of the N+ substrate wafer.

If the N+ substrate wafer underwent step 502 and the surface of the N+ substrate wafer was subsequently annealed, the creation of the N buffer layer at 504 may be facilitated by the annealing process. If the N+ substrate layer did not undergo step 502 and the surface of the N+ substrate was subsequently not annealed, then the N buffer layer may be created on the N+ substrate without further treatment of the surface of the N+ substrate.

Additionally, the level of crystal damage inflicted in step 508 may be more than, the same as, or less than the level of crystal damage inflicted in step 502. Further, the level of crystal damage in step 508 may change depending on whether or not step 502 was completed. For example, if step 502 is omitted, the crystal damage inflicted in step 508 may be higher than if step 502 was performed. Crystal damage in both the N+ substrate and N buffer layers may serve to limit the injection of charge carriers into the bulk of the diode. If crystal damage in the N+ substrate is also limiting injection, then the crystal damage in the N buffer layer may not need to be as extensive. The surface of the N buffer layer may be annealed in order to prepare for other step(s) in method 500.

In some examples, method 500 may include step 510. At 510, crystal damage may be inflicted to the N− bulk layer. The level of crystal damage in the N− bulk layer generally will be less than the level of crystal damage in the N buffer layer and the N+ substrate layer. The method of inflicting crystal damage in the N− bulk layer may be the same as is used in step 508 and/or in step 502. The crystal damage may be inflicted in any suitable portion(s) within the N− bulk layer, such as in one or more damaged sublayers, but not inflicted in other suitable portions within the N− bulk layer, such as in one or more undamaged sublayers.

Although inflicting crystal damage to one or more layers of the cathode assembly are shown as discrete steps in FIG. 7, the crystal damage may be inflicted in any suitable way(s). For example, inflicting crystal damage on a single layer (or a single sublayer) may be performed in multiple steps with one of more of those steps being performed after one or more other steps of method 500 are performed. Alternatively, inflicting crystal damage may be performed on two or more layers (or two or more sublayers) on a single step.

Method 500 may further include one or more other steps, such as applying an anode structure to the N− bulk layer and/or a cathode electrode to the N+ substrate layer. Any anode structure may be used, such as any of the anode assemblies described in reference to FIGS. 3-5 may be used to limit the injection of charge carriers into the diode.

The steps of method 500 have been described above in a particular order but it should be understood that the steps may be completed in any suitable order. For example, step 508 of inflicting crystal damage to the N buffer layer may occur prior to step 506 of creating the N− bulk layer on the N buffer layer. Alternatively, step 508 of inflicting crystal damage to the N buffer layer may occur after step 506 of creating the N− bulk layer on the N buffer layer. In the latter case, the energy of the radiation may need to be controlled to adjust the depth at which crystal damage occurred so that the crystal damage may largely be contained within the N buffer layer. If the radiation used to inflict the crystal damage in the N buffer layer is directed from the anode side of the diode, then some crystal damage may necessarily occur in the N− bulk layer as the radiation passed through on its way to the N buffer layer. Thus, in some examples, step 510 may be completed concurrently with step 508. Additionally, inflicting crystal damage to one or more of the layers (or one or more sublayers) may be performed before or after the anode assembly is created on the N− bulk layer. Furthermore, although method 500 is shown and described to include particular steps, other examples of method 500 may add, omit, or modify one or more steps.

FIG. 8 is a flow chart showing an example of a method of manufacturing a diode (such as diode 10 or diode 110), which is generally indicated at 600.

At 602, a N buffer layer may be created in a N− bulk wafer. The N− bulk wafer may be created by the float-zone method and/or other suitable method(s). The N buffer layer may, for example, be created by implanting the N− bulk wafer with ions and regulating the temperature of the N− bulk wafer to diffuse those ions. This implantation and diffusion may be responsible for increasing the concentration of doping atoms in a semiconductor of the N buffer layer. The N buffer layer may then have a higher concentration of doping atoms than the rest of the N− bulk layer. By controlling the energy of the ions during implantation, the depth and thickness of the N buffer layer that is created may be controlled.

At 604, a N+ substrate layer may be created in the N− bulk wafer. For example, the N+ substrate layer may be created by implanting the N− bulk wafer with ions and regulating the temperature of the N− bulk wafer to diffuse those ions. As with the creation of the N buffer layer, the concentration of doping atoms in the N+ substrate may be controlled by controlling the parameters of the implantation and diffusion. The depth and thickness of the N+ substrate layer also may be controlled by controlling the parameters of the implantation and diffusion. In some examples, it is possible to have the N+ substrate layer created on an outer edge of the N− bulk wafer, with the N buffer layer disposed adjacent to the N+ substrate layer within the N− bulk wafer.

At 606, crystal damage may be inflicted to the N buffer layer. The crystal damage may be configured to provide recombination centers for charge carriers. The crystal damage may be inflicted, for example, by irradiating the N buffer layer with ions. The ions may be helium ions, hydrogen ions, and/or any other ions that can inflict the required crystal damage. The crystal damage may be inflicted in any suitable portion(s) within the N buffer layer, such as in one or more damaged sublayers, but not inflicted in other suitable portions within the N buffer layer, such as in one or more undamaged sublayers. The level of crystal damage inflicted in step 606 may be more than, the same as, or less than the level of crystal damage inflicted in one or more other steps of method 600, such as step 608.

Furthermore, the level of crystal damage in step 606 may change depending on whether or not step 608 is completed. For example, if step 608 is omitted, the crystal damage inflicted in step 606 may be higher than if step 608 is performed. Crystal damage in both the N+ substrate and N buffer layers may serve to limit the injection of charge carriers into the bulk of the diode. If crystal damage in the N+ substrate is also limiting injection, then the crystal damage in the N buffer layer may not need to be as extensive. The depth at which the crystal damage occurs may be controlled by varying the energy of the irradiating ions, thus allowing the crystal damage to be localized within the N buffer layer or within one or more damaged sublayers within the N buffer layer. At 607, an anode assembly may be created on or on top of the N− bulk wafer.

In some examples, method 600 may include step 608. At 608, crystal damage may be inflicted to the N+ substrate layer. The crystal damage may be accomplished by the methods described in step 606, though the level of crystal damage in the N+ substrate layer may be more than, the same as, or less than the level of damage in the N buffer layer. The crystal damage may be inflicted in any suitable portion(s) within the N+ substrate layer, such as in one or more damaged sublayers, but not inflicted in other suitable portions within the N+ substrate layer, such as in one or more undamaged sublayers. As in 606, the depth at which the crystal damage occurs may be controlled by varying the energy of the irradiating ions, thus allowing the crystal damage to be localized within the N+ substrate layer or within one or more damaged sublayers within the N+ substrate layer.

In some examples, method 600 may include step 610. At 610, crystal damage may be inflicted to the N− bulk wafer. The level of crystal damage in the N− bulk layer generally will be less than the level of crystal damage in the N buffer layer and the N+ substrate layer. The crystal damage may be inflicted in any suitable portion(s) within the N− bulk layer, such as in one or more damaged sublayers, but not inflicted in other suitable portions within the N− bulk layer, such as in one or more undamaged sublayers. The method of inflicting crystal damage in the N− bulk wafer may be the same as is used in step 606 and/or in step 608.

Although inflicting crystal damage to one or more layers (or sublayers) of the cathode assembly are shown as discrete steps, the crystal damage may be inflicted in any suitable way(s). For example, inflicting crystal damage on a single layer or sublayer may be performed in multiple steps with one of more of those steps being performed after one or more other steps of method 600 are performed. Alternatively, inflicting crystal damage may be performed on two or more layers (or two or more sublayers) on a single step.

Method 600 may further include one or more other steps, such as applying an anode structure to the N− bulk layer and/or a cathode electrode to the N+ substrate layer. Any anode structure may be used, such as any of the anode assemblies described in reference to FIGS. 4-6 and/or as described below may be used to limit the injection of charge carriers into the diode.

The steps of method 600 have been discussed above in a particular order but it should be understood that the steps may be completed in any suitable order. For example, step 606 of inflicting crystal damage to the N buffer layer may occur prior to step 604 of creating the N+ substrate layer in the N− bulk wafer. Alternatively, step 606 of inflicting crystal damage to the N buffer layer may occur after step 604 of creating the N+ substrate layer in the N− bulk wafer. In the latter case, the energy of the radiation may need to be controlled to adjust the depth at which crystal damage occurred so that the crystal damage may largely be contained within the N buffer layer. If the radiation used to inflict the crystal damage in the N buffer layer is directed from the anode side of the diode, then some crystal damage may necessarily occur in the N− bulk layer as the radiation passed through on its way to the N buffer layer. Thus, in some examples, step 610 may be completed concurrently with step 606. Step 610 may be completed at any point during method 600, such as before step 602, after step 610, or between steps 602 and 610. Additionally, although method 600 is shown and described to include particular steps, other examples of method 600 may add, omit, or modify one or more steps.

Figure 9:
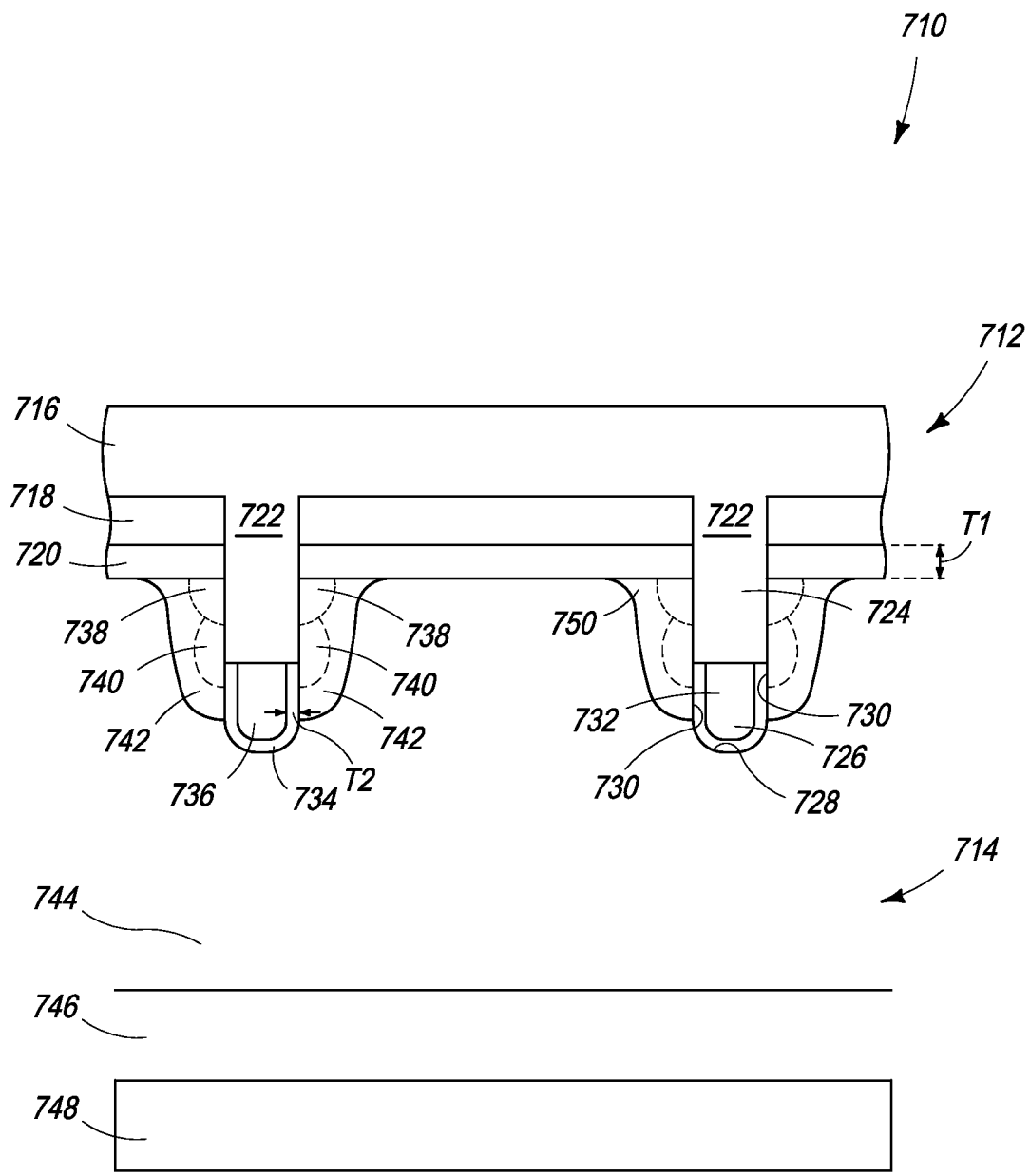
FIG. 9 is a schematic sectional view of another example of the diode of FIG. 1.

FIG. 9 is a schematic sectional view of another example of a diode 1, which is generally indicated at 710. Diode 710 may include any suitable structure configured to provide the diode with low parasitic resistance and a flat leakage current. Diode 710 may include an anode assembly 712 and a cathode assembly 714.

The anode assembly may include any suitable structure. For example, anode assembly 712 may include an anode electrode 716, a gate electrode layer 718, a gate oxide layer 720, one or more trenches 722, and at least one P− body region 742. Anode electrode 716 may be made of any appropriate metal(s). Additionally, anode electrode 716 may be shaped to extend through any suitable portion of one or more (or all) of trenches 722, such as through an upper portion of trench(es) 722. Although anode electrode 716 is shown to be a unitary electrode that at least partially extends through trench(es) 722, the anode electrode may be made of two or more components that are in electrical communication with each other. For example, anode material (not shown) may be used in the trench(es) and may be in contact with the anode electrode.

Gate electrode layer 718 may be under or adjacent the anode electrode. The gate electrode layer may be made of any suitable conducting material(s), such as conducting material(s) with an appropriate work function. For example, gate electrode layer 718 may be composed of highly doped N-type polysilicon. The concentration of doping atoms may, for example, be between about $10^{20}$ and about $10^{21}$ atoms per cubic centimeter. The gate electrode layer may have a thickness between about 600 and about 2000 angstroms, though other thicknesses may also be used. Gate electrode layer 718 may be disposed underneath the anode electrode and/or may be shorted to the anode electrode.

Gate oxide layer 720 may be disposed under/or adjacent gate electrode layer 718. The gate oxide layer may have a first thickness T1 of about thirty to two hundred angstroms, which may sometimes be referred to being a "thin layer." The gate oxide layer may be an insulating layer made of any suitable materials. For example, the gate oxide layer may be composed of silicon dioxide, silicon oxynitride, and/or any other suitable dielectric material(s).

Anode assembly 712 may include one or more trenches 722 that extend through any suitable layer(s). For example, one or more (or all) of trenches 722 may extend from the anode electrode down through the gate electrode layer and/or the gate oxide layer. In some examples, one or more of trenches 722 may extend through the gate electrode layer and the gate oxide layer to one or more portions of the cathode assembly. One or more (or all) of trenches 722 may include an upper portion 724 proximate the anode electrode and a lower portion 726. The lower portion may have a bottom 728 and a plurality of sidewalls 730 which may be referred to as defining a bottom volume 732.

Bottom 728 and/or one or more of sidewalls 730 may be lined with an insulating material or insulating layer 734, which may include any suitable structure configured to electrically insulate the trench from the cathode assembly, such as from the N− bulk layer discussed below. Insulating material 734 may have a second thickness T2 in a range of about 400 to about 1500 angstroms, which may sometimes be referred to as being a "thick layer." In some examples, the second thickness of the insulating material may be larger than the first thickness of the gate oxide layer. The insulating material may be any suitable material(s) capable of withstanding high electric fields. For example, insulating material 734 may be a single oxide layer or a nitride layer together with an oxide layer.

The bottom volume may include a conductive material 736, such as above or on top of bottom 728 and/or between the insulated sidewalls. In other words, conductive material may be disposed within bottom volume 732, for example, conductive material 736 may be disposed between opposing sidewalls of plurality of sidewalls 730. In some examples, lower portion 726 and/or bottom volume 732 may be filled with conductive material 726. Conductive material 736 may be any conductor with suitable work function, for example, highly doped P-type polysilicon, highly doped N-type polysilicon, and/or one or more metals. In the case of highly doped polysilicon, N-type or P− type, the concentration of doping atoms may be above about $10^{19}$ atoms per cubic centimeter. Conductive material 736 may be electrically insulated from cathode assembly 714, such as the N− bulk layer described below, via the insulating material. The conductive material may be in electrical communication with anode electrode 716. In some examples, anode electrode 716 may extend to contact the conductive material. Anode electrode 716 may also be configured to make contact with gate electrode layer 718 and conductive material 736 (and N+ and/or P+ contact areas as discussed below) on one side and electrical contact with the rest of a circuit (not shown) on the other side.

Trench(es) 722 may have any suitable shape(s). For example, one or more (or all) of trenches 722 may be rectangular or U-shaped (such as with rounded corners), which may avoid high electric field magnitudes that may form at the corners of a trench. In some examples, the width of one or more (or all) of trenches 722 may be between about 0.5 and about 1 micron and the depth may be between about 2 and about 10 microns.

In some examples, one or more (or all) of trenches 722 may have associated one or more P− body regions 742. Although "P" is used for clarity, body region 742 may be a second conductive type that could either be P-type or N-type. The "P−" is used herein to indicate that the P− body region(s) may have a lower concentration of doping atoms than, for example, the P+ contact area(s) discussed below. P− body region(s) 742 may be disposed under or adjacent gate oxide layer 720. The concentration of doping atoms may enable a flat leakage current during reverse biased operation of the diode between about 1 volts and a rated voltage, such as between about $10^{17}$ and about $10^{18}$ atoms per cubic centimeter. P− body region(s) 742 may contact gate oxide layer 720 and/or cathode assembly 714, such as the N− bulk layer discussed below. P− body region 742 may also, when diode 710 includes N+ and/or P+ contact areas as discussed below, be in contact with one or both of the N+ and P+ contact areas and disposed around both of the contact areas.

In some examples, one or more (or all) of trenches 722 may have one or more associated N+ contact areas 738. The N+ contact area may be considered to be a source contact. The "N+" is used herein to indicate that the semiconductor (1) is a N-type, and (2) has been doped to a higher concentration than, for example, the N− bulk layer discussed below. However, the source contact may be described as being of a first conductive type that could be N-type or P-type. The N+ contact area may have a concentration of doping atoms above about $10^{19}$ atoms per cubic centimeter. This concentration may allow ohmic contact between the N+ contact area and the upper portion of trench(es) 722 so that, for example, electrons can readily flow between the anode and the N+ contact area.

In some examples, one or more (or all) of trenches 722 may have one or more associated P+ contact areas 740. The label "P+" is used herein to indicate that the semiconductor (1) is a P-type, and (2) has been doped to a higher concentration than, for example, the P− body region discussed above. However, the P+ contact area may be described as being of a second conductive type that could be P-type or N-type. P+ contact area 740 may have a concentration of doping atoms that is configured to allow ohmic contact with upper portion 724 of trench 722 so that holes can readily flow between the anode electrode and the P+ contact area. For example, the P+ contact area may have a concentration of doping atoms above about $3 \times 10^{17}$ atoms per cubic centimeter.

Although diode 710 is shown in FIG. 9 to include, in some examples, N+ contact areas 738 and P+ contact areas 740, other examples of diode 710 may exclude N+ and P+ contact areas or may include only N+ contact areas 738 or only P+ contact areas 740.

Cathode assembly 714 may include a N− bulk layer 744, a N+ substrate layer 746, and a cathode electrode 748. The N− bulk layer may be connected to anode assembly 712 and/or may be on or over N+ substrate layer 746. For example, trench(es) 722 may extend from anode electrode 716 down through P− body region 742 and into N− bulk layer 744 so that the N− bulk layer is in contact with lower portion 726 of one or more (or all) of trenches 722. In some examples, N− bulk layer 744 may contact lower portion 726 but not upper portion 724 of one or more (or all) of trenches 722. The "N−" is used herein to indicate that the semiconductor (1) is a N-type, and (2) has a lower concentration than, for example, N+ contact area 738. However, N− bulk layer 744 may be described as being of a first conductive type that could be N-type or P-type. The thickness and doping concentration of the N− bulk layer may be configured based on a predetermined breakdown voltage. For example, the concentration of doping atoms may be between about $3 \times 10^{14}$ and about $3 \times 10^{16}$ atoms per cubic centimeter.

N+ substrate layer 746 may be disposed over or adjacent cathode electrode 748 and/or underneath or adjacent N− bulk layer 744. In some examples, N+ substrate layer 746 may be disposed between N− bulk layer 744 and cathode electrode 748. The "N+" is used herein to indicate that the semiconductor (1) is a N-type, and (2) has a higher concentration than, for example, N− bulk layer 744. However, substrate layer 746 may be described as being of a first conductive type that could be N-type or P-type. The N+ substrate layer may have a concentration of doping atoms that is configured to allow ohmic contact with cathode electrode 748. For example, the concentration of doping atoms in N+ substrate layer 746 may be above about $10^{19}$ atoms per cubic centimeter. N+ substrate 746 and N− bulk layer 744 may together be referred to as a "drain region" of the first conductive type that is connected to P− body region 742.

Cathode electrode 748 may be made of any appropriate metal(s). The cathode electrode may be configured to make ohmic contact with N+ substrate layer 746 on one side and electrical contact with the rest of a circuit (not shown) on the other side.

When diode 710 is in a forward biased state, that is, when the anode electrode is at a higher electrical potential than the cathode electrode, a conducting channel 750 may be formed in P− body region(s) 742 adjacent to gate oxide layer 720. The gate electrode layer may, in some examples, be shorted to anode electrode 716 so that the gate electrode will also be at a higher electrical potential than the cathode electrode. As the P− body region(s) are separated from the gate electrode layer by thin gate oxide layer 720, the mobile positive holes in the P− body region(s) may be repelled by the higher potential of the gate electrode and may move away from the gate oxide layer, leaving behind a negatively charged depletion layer adjacent to the gate oxide layer. Also, the energy level bands in the semiconductor may bend downwards near the gate oxide layer, increasing the number of mobile electrons in an inversion layer directly adjacent to the gate oxide layer. Conducting channel 750 may be formed in the inversion layer within each of the one or more P− body regions. When the diode is in a forward biased state, electrons may flow upward from cathode electrode 748 through the N-type layers 746 and 744 and into the area between two of trenches 722, then may flow horizontally through conduction channel 750 beneath the gate oxide layer, then may flow through N+ contact areas 738 (when present) and into anode electrode 716.

When diode 710 is in a reverse biased state, such as when the cathode electrode is at a higher electrical potential than the anode electrode, no such conducting channel may be formed in the P− body region. Furthermore, during reverse bias, the depletion regions associated with one or more trenches 722 may extend away from those trenches and merge in the regions between the trenches. With the edges of the depletion region removed from proximity to the metal contacts, there will be no barrier lowering affects, such as those due to image charge formation, and the diode may exhibit a flat leakage current.

For some applications it may be preferable for diode 710 to exclude either or both of N+ contact areas 738 and P+ contact areas 740, such as when the diode is to have a low rated voltage. For low rate voltages, diode 710 may be a majority carrier device. In other words, the current may be primarily due to the movement of electrons and not the movement of holes. When the diode is in a forward biased state, the electrons may flow upward from cathode electrode 748, through the N-type layers into the area between two adjacent trenches 722, then horizontally through conduction channel 750 in P− body region(s) 742 beneath gate oxide layer 720 and directly into anode electrode 716. Along this path, electrons may encounter (a) a Schottky barrier where the metal of the anode electrode connects with the semiconductor material of the P− body region(s) and/or (b) a channel barrier in conducting channel 750. The height of the Schottky barrier may be determined by the materials used for the anode electrode and the P− body region(s), as well as the metallurgic quality of the contact between those two materials. This metallurgic quality may be difficult to control and there may subsequently be large variations in the height of the Schottky barrier. The channel barrier may be more easily controlled and determined by the concentration of doping atoms in the P− body region(s), the width of the P− body region(s) that the electrons will travel through, the thickness of the gate oxide layer, and/or the work function of the gate electrode layer above the gate oxide layer. Whichever of these two barriers is higher will determine the behavior of the diode. In some examples, it may be preferable that the channel barrier height is larger than the Schottky barrier height.

Figure 10:
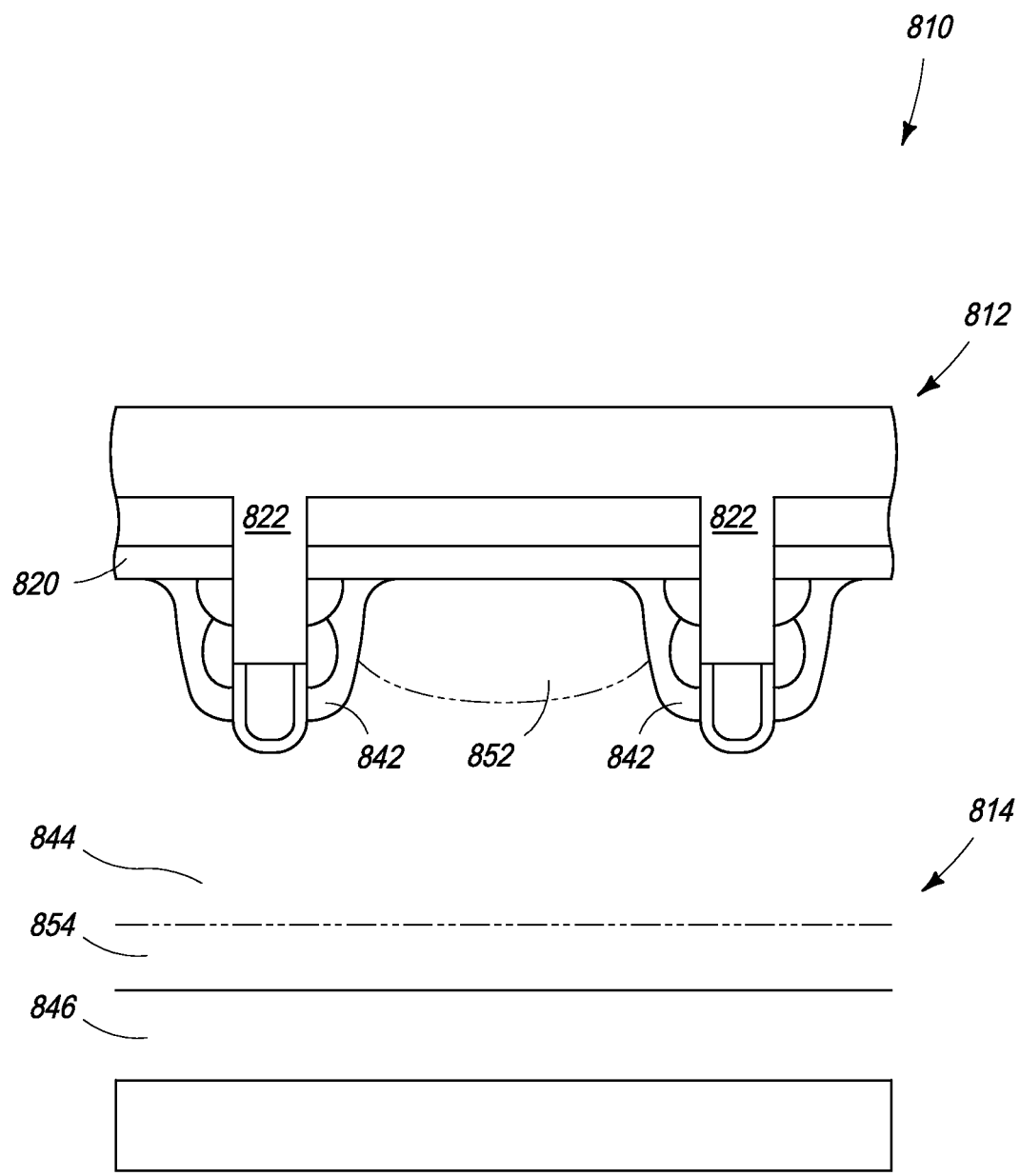
FIG. 10 is a schematic sectional view of a further example of the diode of FIG. 1.

FIG. 10 is a schematic sectional view of a further example of diode 1, which is generally indicated at 810. The numbered elements of diode 810 may correspond to similarly numbered elements of diode 710 in FIG. 9. The size, composition, and doping concentrations of the various components of diode 710 may be similar to those of diode 810. Diode 810 may include at least one N region 852 in between two adjacent trenches 822 and a N buffer layer 854 disposed between a N− bulk layer 844 and a N+ substrate layer 846. In some examples, at least one N region 852 may be in between every two adjacent trenches 822.

N region(s) 852 may be disposed under a gate oxide layer 820 and between two P− body regions 842 associated with trenches 822. N region(s) 852 may be created, for example, by implanting additional donor atoms into N− bulk layer 844, thus increasing the concentration of doping atoms, as further described below. The concentration of doping atoms in N region(s) 852 may be between about $10^{16}$ and about $10^{17}$ atoms per cubic centimeter. The N region(s) may decrease the series resistance of diode 810 as compared to diode 710 without significantly reducing the breakdown voltage.

N buffer layer 854 may be disposed between N− bulk layer 844 and N+ substrate layer 846. The concentration of doping atoms in the N buffer layer may be between about $10^{16}$ and about $10^{17}$ atoms per cubic centimeter. The thickness of the N buffer layer may be between about 5 and about 10 microns. For certain applications, for example in high voltage situations, the presence of the N buffer layer may allow for a reduced thickness of N− bulk layer 844. The presence of the N buffer layer also may allow for the reduction of the amount of stored charge that builds up during forward conduction in the diode. This stored charge must be removed before the diode can adequately block current in the reverse biased state. Although FIG. 10 shows diode 810 with both N region(s) 852 and N buffer layer 854, diode 810 may have one, both, or neither of N region(s) 852 and N buffer layer 854.

Figure 11:
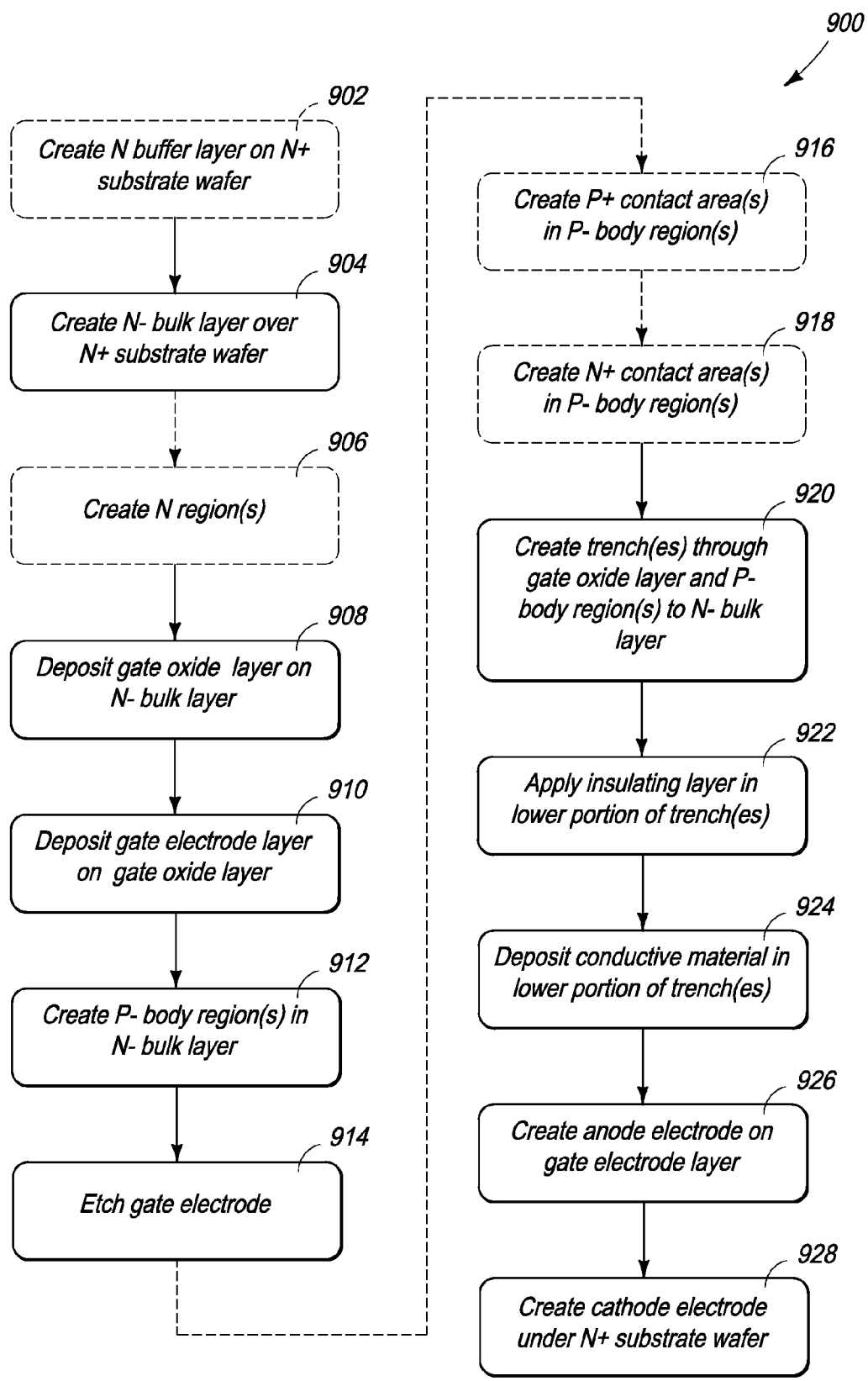
FIG. 11 is a flow chart of a further example of a method of manufacturing a diode.

FIG. 11 shows an example of a method of manufacturing a diode (such as diode 710 or 810), which is generally indicated at 900. In the following discussion of method 900, most numbered elements will refer to diode 710, though the elements also could refer to the corresponding numbered elements of diode 810 and/or one or more other diodes that are described in the present disclosure.

At 904, a N− bulk layer may be created over a N+ substrate wafer. The N+ substrate wafer may be created via the Czochralski method and/or any other suitable method(s). The N− bulk layer may, for example, be deposited via epitaxial growth on the N+ substrate layer. If optional step 902 described below is completed, then the N− bulk layer may be deposited via epitaxial growth on a N buffer layer.

At 908, a gate oxide layer may be deposited on the N− bulk layer. The gate oxide layer may be an insulating layer composed of silicon dioxide, silicon oxynitride, and/or any other suitable dielectric material(s).

At 910, a gate electrode layer may be deposited on the gate oxide layer.

Figure 13:
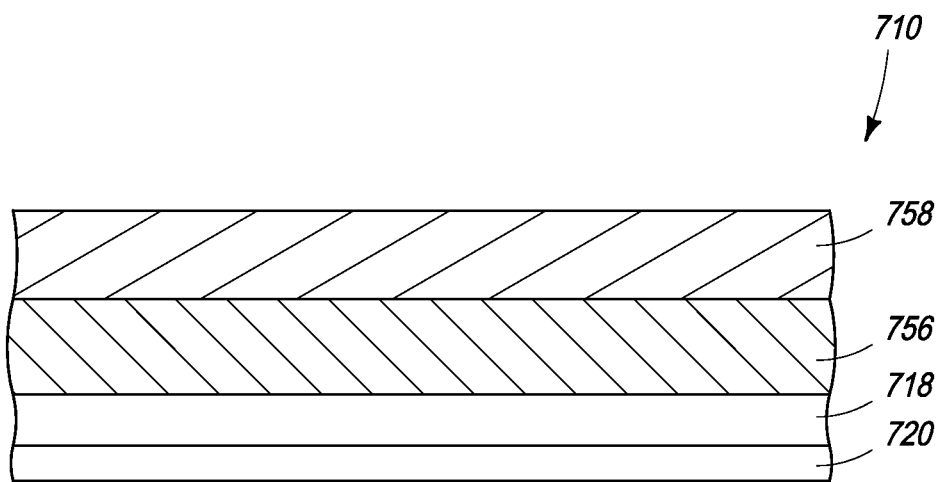
FIGS. 13-19 are schematic sectional views of a diode being manufactured according to the method of FIG. 11 or FIG. 12.

At 912, one or more P− body regions may be created in the N− bulk layer. Creating the P− body region(s) may include, for example, depositing a nitride layer on the gate electrode layer and/or depositing a photoresist layer on the nitride layer. FIG. 13 shows diode 710 during an intermediate step of being manufactured according to method 900 where a nitride layer 756 lies over or on gate electrode layer 718 and gate oxide layer 720, and a photoresist layer 758 lies over or on the nitride layer. Photoresist layer 758 may then be etched so that one or more portions of the photoresist layer are removed.

Figure 14:
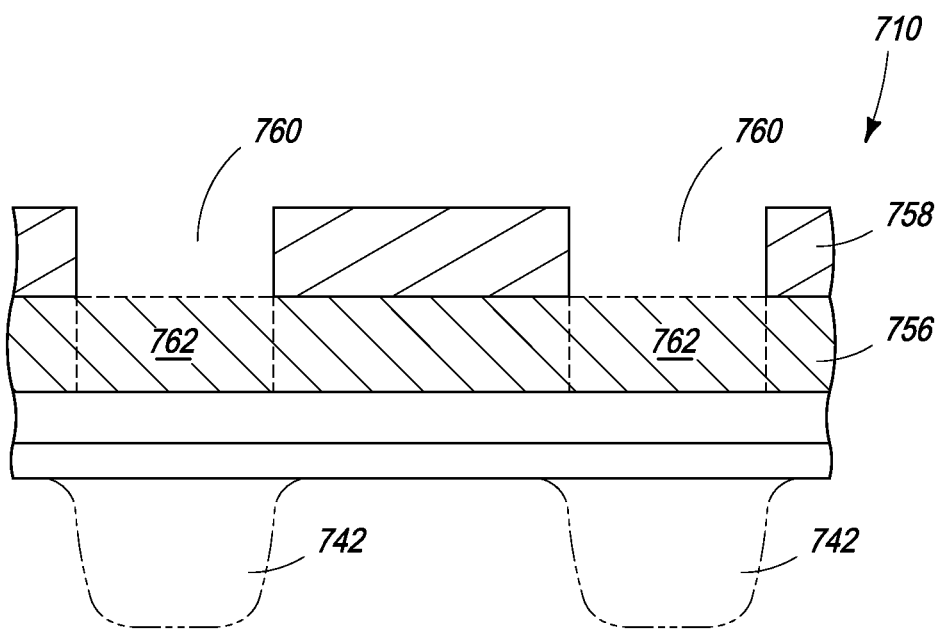

FIG. 14 shows diode 710 during an intermediate step of being manufactured according to method 900 where one or more portions 760 of photoresist layer 758 have been etched or otherwise removed. After the photoresist layer has been etched, nitride layer 756 may be etched so that one or more portions 762 of the nitride layer may be removed. The dashed lines in FIG. 14 indicate the portions of the nitride layer that may be removed. During subsequent steps when the surface of the diode is irradiated with ions, the remaining nitride layer may prevent those ions from penetrating the surface of the diode. The parts of the diode underneath portions 762 of the nitride layer that have been removed will not have this protection and the irradiating ions will penetrate the diode, potentially changing the properties of the affected layers of the diode, for example, increasing the concentration of doping atoms and/or changing the type of doping atoms. The remaining nitride layer may sometimes be referred to as a "mask." Alternatively, the nitride layer in FIG. 14 may sometimes be referred to as a "channel mask." The channel mask is used to create one or more P− body regions where conducting channel 750 (shown in FIG. 9) will form during forward biased operation of the diode. Creating one or more P− body regions may include irradiating the N− bulk layer with ions through the channel mask, the ions being configured to create one or more P− body regions in the N− bulk layer. The P− body regions are indicated in FIG. 14 by the dash-dot-dot lines. The remainder of photoresist layer 758 may then be removed.

Figure 15:
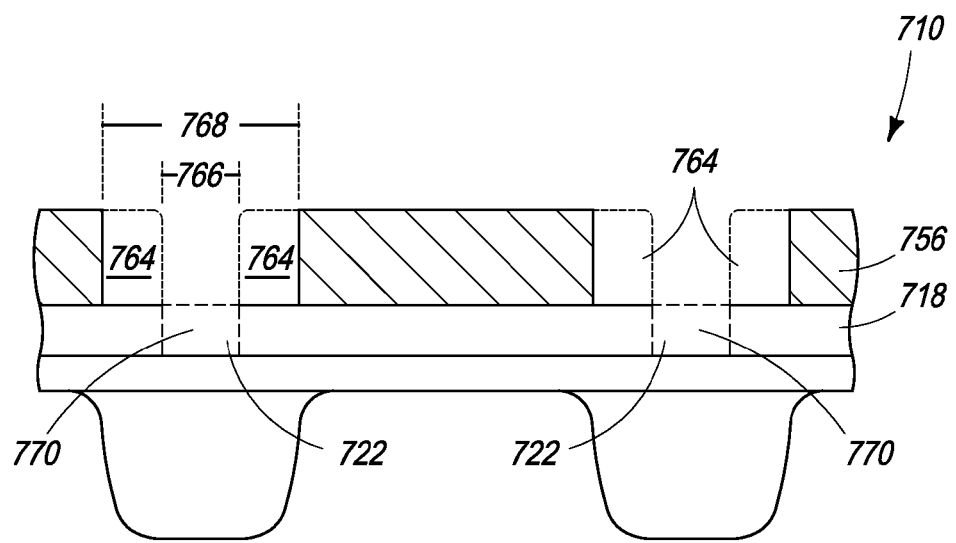

At 914, the gate electrode layer may be etched or otherwise removed. FIG. 15 shows diode 710 during an intermediate step of being manufactured according to method 900 where the photoresist layer of step 912 has been removed. Nitride sidewalls 764 may be added to nitride layer 756 to create one or more trench masks. The trench mask(s) may have any suitable width, such as a width 766 smaller than a width 768 of the one or more channel masks. The trench mask(s) may, for example, be the combination of nitride layer 756 and nitride sidewalls 764. With the trench mask in place, one or more portions 770 of gate electrode layer 718 may be etched or otherwise removed. The etching of the gate electrode layer may sometimes be referred to as an initial sub-step of making the one or more trenches 722.

Figure 16:
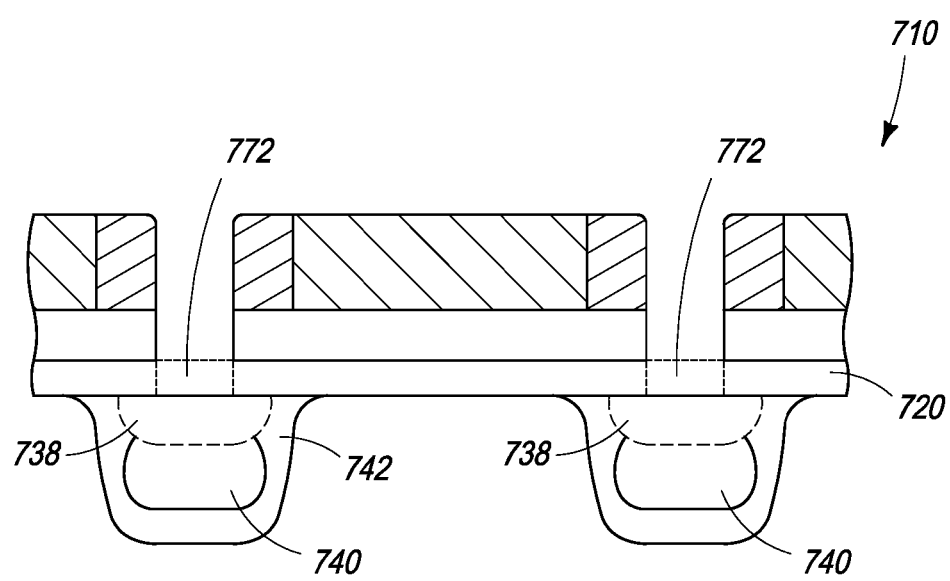

At 920, one or more trenches may be created through the gate oxide layer and the one or more P− body regions to the N− bulk layer. FIG. 16 shows diode 710 during an intermediate step of being manufactured according to method 900 where gate electrode layer 718 has been etched. The trenches are continued as portions 772 of gate oxide layer 720 that are etched using the trench mask that was created, for example, in step 914. The trench(es) may be completed when they are further etched down through P− body regions 742 and into N− bulk layer 744 using the trench mask that was created, for example, in step 914.

Figure 17:
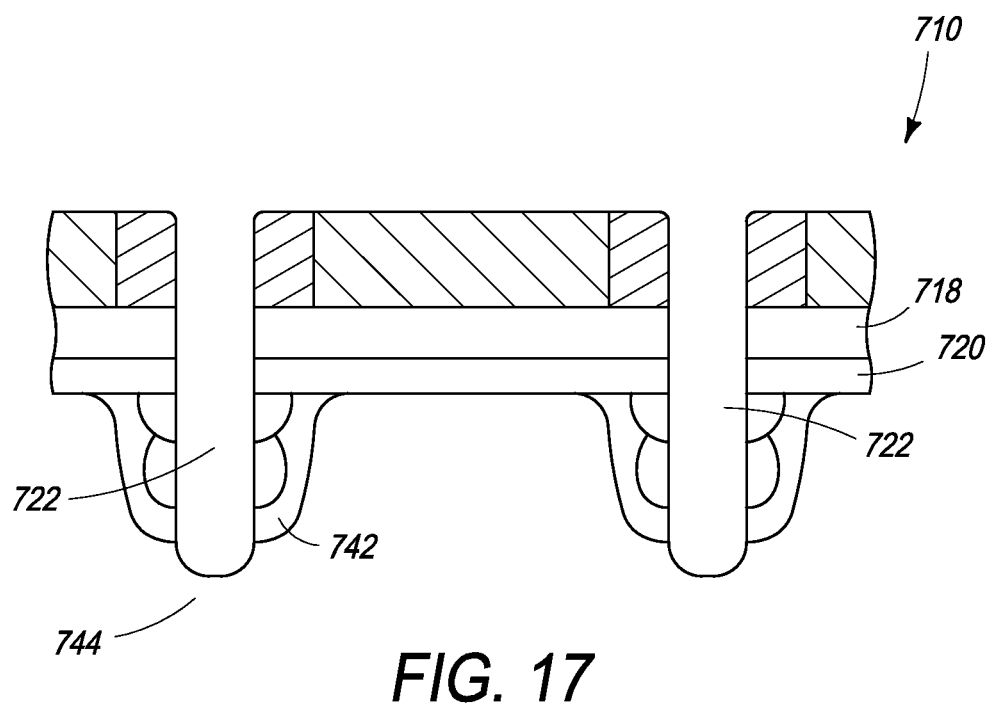

FIG. 17 shows diode 710 during an intermediate step of being manufactured according to method 900 where trench(es) 722 have been completely etched through gate electrode layer 718, gate oxide layer 720, P− body region 742, and into N− bulk layer 744. The shape of the bottom of each trench may be U-shaped, such as with rounded or curvilinear corners. However, other examples of trench(es) 722 may have sharper and/or rectilinear corners.

Figure 18:
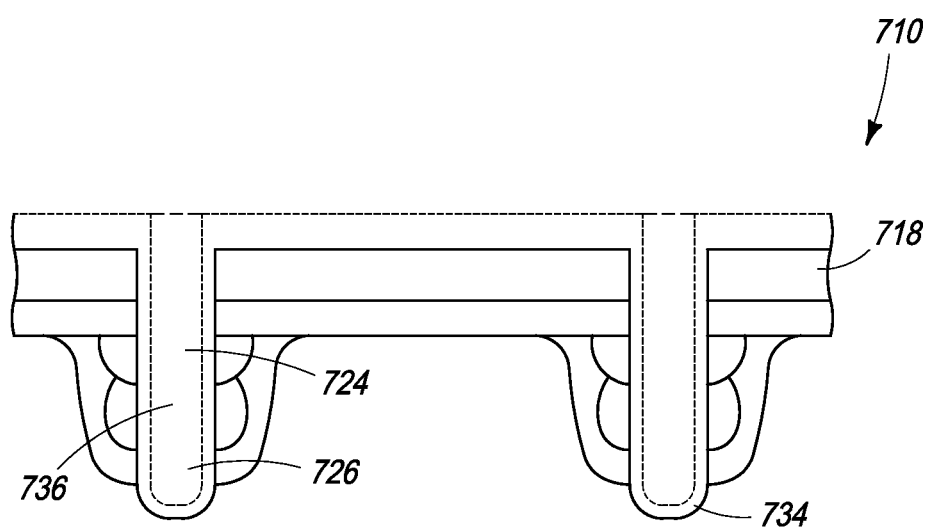

At 922, an insulating layer may be applied in the lower portions of trench(es) 722. FIG. 18 shows diode 710 during an intermediate step of being manufactured according to method 900 where nitride layer 756 and nitride sidewalls 764 have been removed. The insulating layer may be applied to the entire surface of the as-yet-incomplete diode. That is, the insulating layer may be applied in lower portion 726 of the trench(es), upper portion 724 of the trench(es), and on top of gate electrode layer 718. Insulating layer 734 may, in some examples, be a combination of two or more materials, such as a thin nitride layer (e.g., approximately 50 angstroms thick) and an oxide layer (e.g., at least 350 angstroms thick). Alternatively, the insulating layer may also be a single insulating material. The insulating layer may be applied evenly to the irregular surface of the half-formed diode by any suitable methods, such as via low pressure chemical vapor deposition and/or any other appropriate means.

Figure 19:
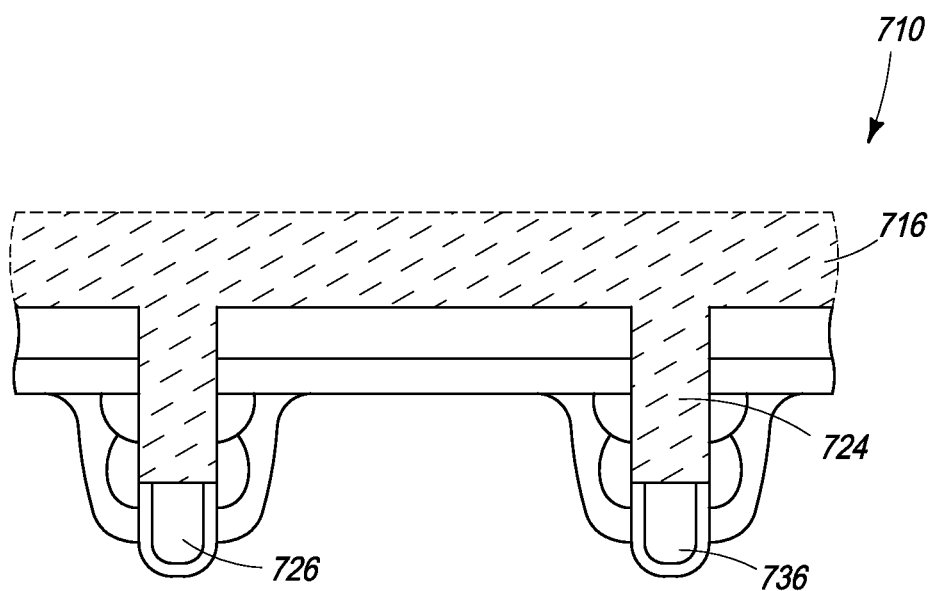

At 924, a conductive material may be deposited in the lower portion of the trench(es). FIG. 18 shows conductive material completely filling the trench(es), indicated by the heavier dashed line at the top of trench(es) 722. In other words, conductive material 736 may be deposited in lower portion 726 of the trench(es) and/or in upper portion 724 of the trench(es). The conductive material and the insulating layer may then both be etched down (or otherwise removed) to their final location. FIG. 19 shows diode 710 during an intermediate step of being manufactured according to method 900 where conductive material 736 and insulating layer 734 [should be labeled in FIG. 19] have been etched down to their final location.

At 926, an anode electrode may be created on the gate electrode layer. The anode electrode may extend downward through the trench(es). In some examples, the anode electrode may contact the conductive material in the lower portion of the trench(es). In FIG. 19, anode electrode 716 is shown with a dashed outline and filled with dashed diagonal hatch marks. At 928, a cathode electrode may be created under the N+ substrate wafer. The cathode electrode may be created by any suitable methods, such as via backside metallization.

In some examples, method 900 may include step 902. At 902, a N buffer layer may be created on the N+ substrate wafer. For example, FIG. 10 shows N buffer layer 854 between N+ substrate layer 846 and N− bulk layer 844 in diode 810. The N buffer layer may be created, for example, by epitaxial growth on top of the N+ substrate wafer. If this step is included in method 900, then the N− bulk layer of step 904 may be created on top of the N buffer layer, for example, by epitaxial growth.

In some examples, method 900 may include step 906. At 906, one or more N regions may be created. FIG. 10 shows N region 852 disposed between two adjacent P− body regions 842. The N region(s) may be created, for example, by blanket ion implantation where the entire active area of the device is exposed. Alternately, the N region(s) may be created with the aid of masks to avoid N-type ion implantation in the future location of conducting channel 850.

In some examples, method 900 may include step 916. At 916, one or more P+ contact areas may be created in the one or more P− body regions. As step 916 would be completed after step 914 (during which nitride walls 764 were added to nitride layer 756 to create the trench mask), no additional masks may need to be created to create P+ contact areas 740. The P+ contact areas may be created by any suitable process, such as by ion implantation and diffusion. The diffusion of implanted ions may cause the P+ contact areas to be wider than the width of the opening in the mask. The depth of the P+ contact areas may, for example, be controlled by controlling the energy of the ions being implanted.

In some examples, method 900 may include step 918. At 918, one or more N+ contact areas may be created in the one or more P− body regions. As step 918 would be completed after step 914 (in which nitride walls 764 were added to nitride layer 756 to create the trench mask), no additional masks may need to be created to create the N+ contact areas 738. The N+ contact areas may be created by the process of ion implantation and diffusion. The diffusion of the implanted ions may cause the N+ contact areas to be wider than the width of the opening in the mask. The depth of the N+ contact areas may be controlled, for example, by controlling the energy of the ions being implanted.

The steps of method 900 have been described above in a particular order but the individual steps may be completed in any suitable order and additional steps may be added. Furthermore, other examples of method 900 may omit or modify one or more steps.

Figure 12:
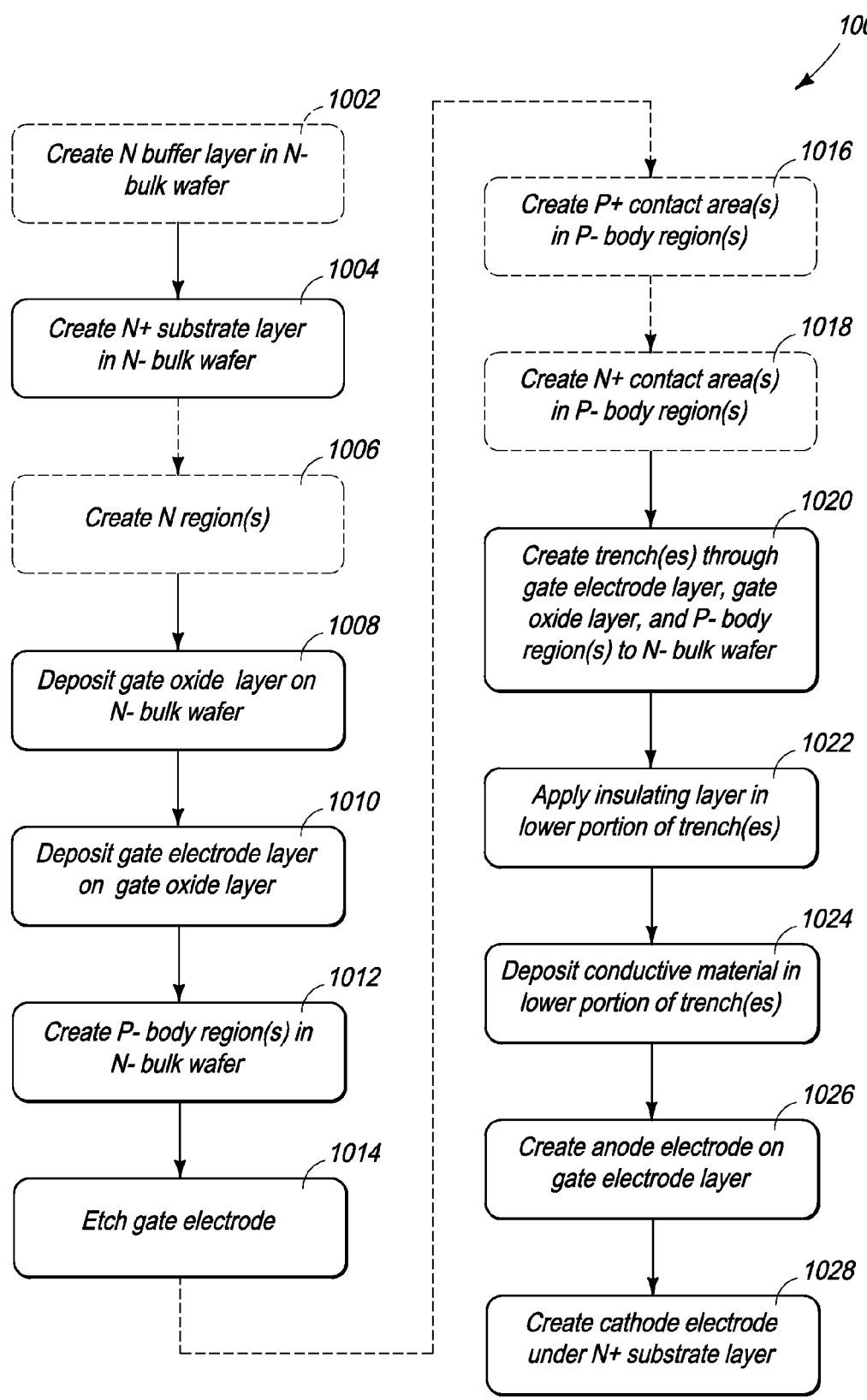
FIG. 12 is a flow chart of another example of a method of manufacturing a diode.

FIG. 12 shows an example of a method of manufacturing a diode (such as diode 710 or 810), which is generally indicated at 1000. FIGS. 13-19 illustrate various steps of method 1000 similar to how those figures illustrate the steps of method 900 as described above.

At 1004, a N+ substrate layer may be created in a N− bulk wafer. The N− bulk wafer may be created by the float-zone method and/or any suitable method(s). The N+ substrate layer may be created, for example, by the process of ion implantation and diffusion. The depth and thickness of the N+ substrate layer may be controlled by controlling the energy of the ions being implanted. The N+ substrate layer may be created at the bottom edge of the N− bulk wafer in preparation for making contact with the cathode electrode in a subsequent step.

At 1008, a gate oxide layer may be deposited on the N− bulk wafer. The gate oxide layer may be an insulating layer composed of silicon dioxide, silicon oxynitride, and/or any other suitable dielectric material(s). At 1010, a gate electrode layer may be deposited on the gate oxide layer.

At 1012, one or more P− body regions may be created in the N− bulk layer. Creating the one or more P− body regions may include, for example, depositing a nitride layer on the gate electrode layer and/or depositing a photoresist layer on the nitride layer.

At 1014, the gate electrode layer may be etched or otherwise removed.

At 1020, one or more trenches may be created through the gate oxide layer and the one or more P− body regions to the N− bulk wafer. At 1022, an insulating layer may be applied in the lower portions of the trench(es). At 1024, a conductive material may be deposited in the lower portion of the trench(es).

At 1026, an anode electrode may be created on the gate electrode layer. The anode electrode may extend downward through the trench(es) created in step 1020. In some examples, the anode electrode may contact the conductive material in the lower portion of the trench(es).

At 1028, a cathode electrode may be created under the N+ substrate wafer. The cathode electrode may be created by any suitable methods, such as via backside metallization.

In some examples, method 1000 may include step 1002. At 1002, a N buffer layer may be created in the N− bulk wafer. For example, FIG. 10 shows N buffer layer 854 between N+ substrate layer 846 and N− bulk layer 844 in diode 810. The N buffer layer may be created, for example, by ion implantation and diffusion in the N− bulk wafer. As with the N+ substrate layer the depth and thickness of the N buffer layer may be controlled by controlling the energy of the ions being implanted.

In some examples, method 1000 may include step 1006. At 1006, one or more N regions may be created. FIG. 10 shows N region 852 disposed between two adjacent P− body regions 842. The N region(s) may be created, for example, by blanket ion implantation where the entire active area of the device is exposed. Alternately, the N region(s) may be created with the aid of masks to avoid N-type ion implantation in the future location of conducting channel 850.

In some examples, method 1000 may include step 1016. At 1016, one or more P+ contact areas may be created in the one or more P− body regions. As step 1016 would be completed after step 1014 (during which the nitride walls were added to the nitride layer to create the trench mask), no additional masks may need to be created to create the P+ contact areas. The P+ contact areas may be created by any suitable process, such as by ion implantation and diffusion. The diffusion of implanted ions may cause the P+ contact areas to be wider than the width of the opening in the mask. The depth of the P+ contact areas may, for example, be controlled by controlling the energy of the ions being implanted.

In some examples, method 1000 may include step 1018. At 1018, one or more N+ contact areas may be created in the one or more P− body regions. As step 1018 would be completed after step 1014 (in which the nitride walls were added to the nitride layer to create the trench mask), no additional masks may need to be created to create the N+ contact areas. The N+ contact areas may be created by the process of ion implantation and diffusion. The diffusion of the implanted ions may cause the N+ contact areas to be wider than the width of the opening in the mask. The depth of the N+ contact areas may be controlled, for example, by controlling the energy of the ions being implanted.

The steps of method 1000 have been described above in a particular order but it should be understood that the individual steps may be completed in any suitable order and that additional steps may be added. For example, steps 1002 and 1004 where the N buffer and N+ substrate layers are created in the N− bulk wafer could be done in either order. Furthermore, other examples of method 1000 may omit or modify one or more steps.

Figure 20:
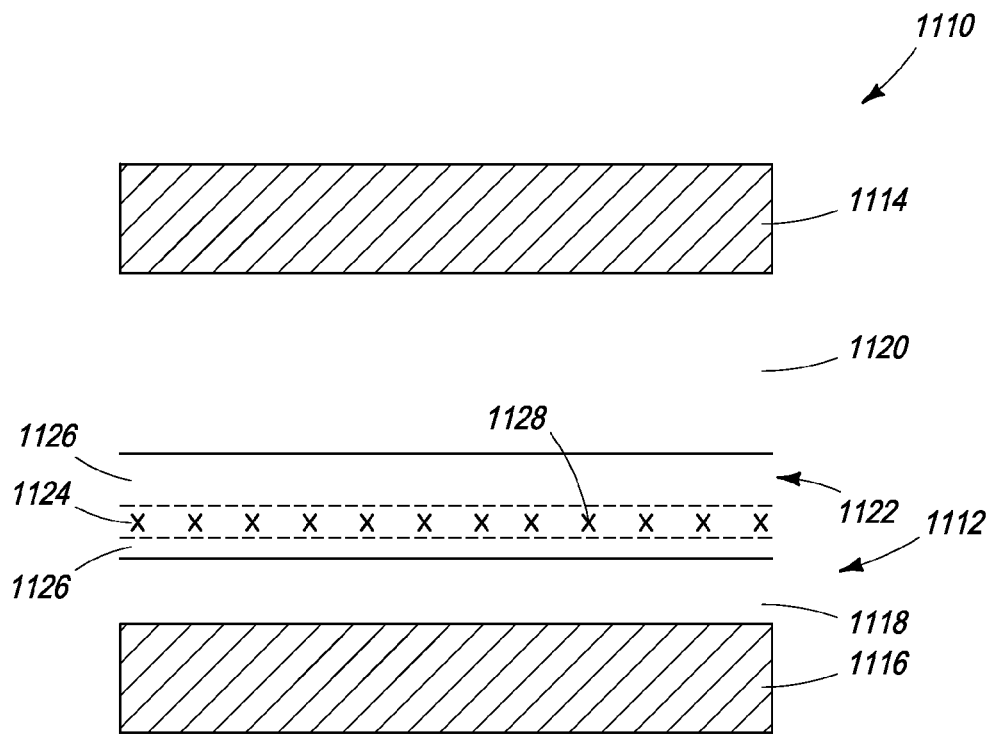
FIG. 20 is a schematic sectional view of another example of the diode of FIG. 1.

FIG. 20 is a schematic sectional view of another example of diode 1, which is generally indicated at 1110. Diode 1110 may include a cathode assembly 1112 and an anode assembly 1114. The cathode assembly may include a cathode electrode (or cathode electrode layer) 1116, a N+ substrate layer 1118, a N− bulk layer 1120, and a N buffer layer 1122.

Cathode electrode 1116 may be made of any appropriate metal(s). The cathode electrode may be configured to make ohmic contact with the N+ substrate layer on one side and electrical contact with a circuit on the other.

N+ substrate layer 1118 may be on or over (or adjacent to) the cathode electrode. The N+ substrate layer may be a N-type semiconductor, which may be formed from a crystal, such as silicon, silicon carbide, and/or any other appropriate semiconductor(s) doped so that the majority charge carriers are electrons. The "+" after "N" in "N+ substrate layer" indicates that the layer may have a higher concentration of doping atoms than, for example, N− bulk layer 1120 and/or N buffer layer 1122. In some examples, the concentration of doping atoms may be above $10^{19}$ atoms per cubic centimeter. N+ 1118 substrate layer may make ohmic contact with cathode electrode layer 1116. N+ substrate layer 1118 may be configured to allow electrons to pass from the cathode electrode layer into N buffer layer 1122 when a forward voltage is applied.

N− bulk layer 1120 may be over or on (or adjacent to) N buffer layer 1122. The N− bulk layer may be an N-type semiconductor, which may be formed from a crystal, such as silicon, silicon carbide, and/or any other appropriate semiconductor(s) doped so that the majority charge carriers are electrons. The "−" after "N" in "N− bulk layer" indicates that the layer may have a lower concentration of doping atoms than, for example, the N+ substrate layer and/or the N buffer layer. In some examples, the concentration of doping atoms may be between about $3 \times 10^{13}$ and about $6 \times 10^{14}$ atoms per cubic centimeter.

N buffer layer 1122 may be over or on (or adjacent to) the N+ substrate layer and/or may be disposed between the N+ substrate layer and the N− bulk layer. The N buffer layer may be a N-type semiconductor, which may be formed from a crystal, such as silicon, silicon carbide, and/or any other appropriate semiconductor(s) doped so that the majority charge carriers are electrons. The lack of "+" or "−" after "N" in "N buffer layer" indicates that the layer may have a higher concentration of doping atoms than, for example, the N− bulk layer and/or may have a lower concentration of doping atoms than, for example the N+ substrate layer.

N buffer layer 1122 may include one or more damaged sublayers 1124 and one or more undamaged sublayers 1126. The damaged sublayer(s) may include crystal damage 1128 configured to limit injection of charge carriers, such as from the N+ substrate layer into the N− bulk layer. The crystal damage in the damaged sublayer(s) may limit injection of charge carriers by, for example, providing recombination centers for the electrons. In some examples, damaged sublayer(s) 1124 may be the only layer(s) or sublayer(s) in the cathode assembly that includes crystal damage.

Undamaged sublayer(s) 1126 are sublayer(s) of N buffer layer that do not include (or exclude) crystal damage 1128. Those sublayer(s) may act as a true buffer, such as when the electric field is reduced to zero within those sublayer(s). For example, there may be no leakage increase at high voltage when the electric field reaches the undamaged sublayer(s). In contrast, the leakage may substantially increase when the electric field reaches the damaged sublayer(s). The undamaged sublayers may allow larger (or more extensive) crystal damage to damaged sublayer(s) 1124, which may allow for stronger stored charge reduction and faster operation. In some examples, undamaged sublayer(s) 1126 may include crystal damage that is substantially less than the crystal damage in the damaged sublayer(s), such as 10 or more times less. In those examples, the damaged sublayer(s) may be described as having a substantial portion (or at least a substantial portion) of the crystal damage in N buffer layer 1122.

N buffer layer 1122 may include any suitable number of damaged sublayers 1124 and undamaged sublayers 1126, and those sublayers may be oriented and/or positioned within the N buffer layer in any suitable ways. For example, N buffer layer 1122 may include damaged sublayer 1124 sandwiched (or disposed) between undamaged sublayers 1126, as shown in FIG. 20. In other examples, the N buffer layer may include a single undamaged sublayer 1126 above (or on top of) damaged sublayer 1124, or a single undamaged sublayer 1126 below damaged sublayer 1124.

Figure 21:
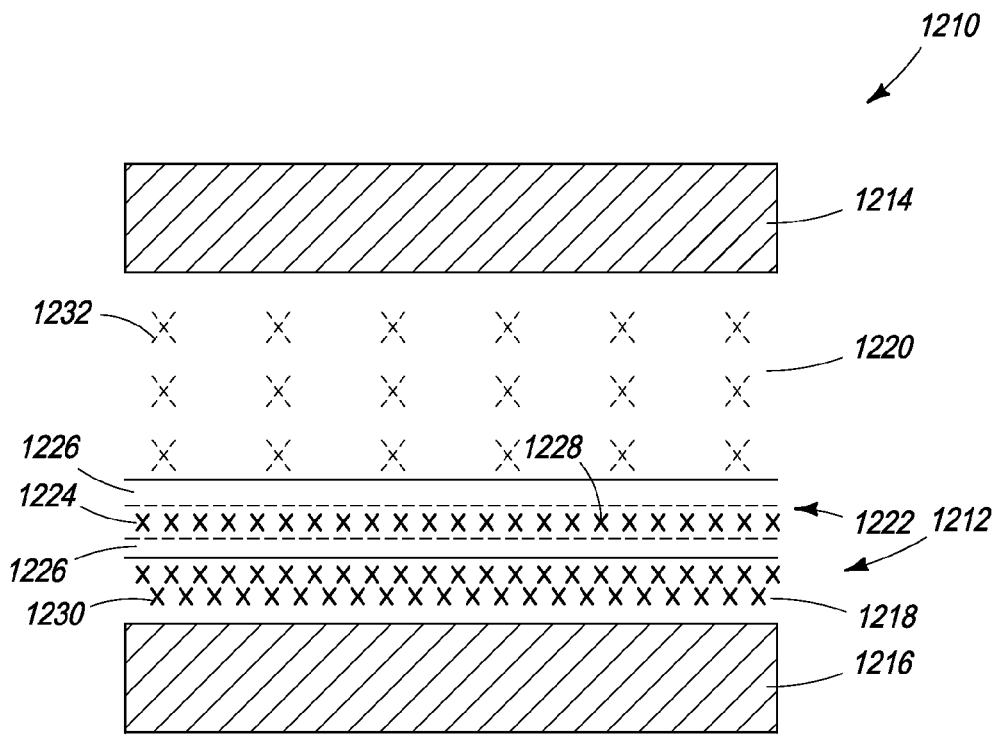
FIG. 21 is a schematic sectional view of a further example of the diode of FIG. 1.

FIG. 21 is a schematic sectional view of a further example of diode 1, which is generally indicated at 1210. The numbered elements of diode 1210 may correspond to similarly numbered elements of diode 1110 in FIG. 20. Diode 1210 may include a cathode assembly 1212 and an anode assembly 1214. The cathode assembly may include a cathode electrode (or cathode electrode layer) 1216, a N+ substrate layer 1218, a N− bulk layer 1220, and a N buffer layer 1222.

In addition to, or instead of, crystal damage 1228 indicated in damaged sublayer(s) 1224 of N buffer layer 1222 there may be crystal damage 1230 in N+ substrate layer 1218. Crystal damage 1230 may be configured to limit the injection of charge carriers, such as by providing recombination centers for charge carriers. The levels of crystal damage in layers 1218 and 1222 need not be the same and the levels of crystal damage in layers 1222 and 1122 need not be the same. In some examples, the amount or extent of crystal damage 1228 required in N buffer layer 1222 to control the injection of charge carriers may be less with both layers 1218 and 1222 including crystal damage than if the crystal damage is present only in N buffer layer 1222.

In some examples, N+ substrate layer 1218 may include damaged sublayer(s) and undamaged sublayer(s) and those damaged and undamaged sublayers may be oriented and/or positioned within N+ substrate layer 1218 in any suitable ways. For example, N+ substrate layer 1218 may include a single damaged sublayer sandwiched (or disposed) between undamaged sublayers. In other examples, the N+ substrate layer may include a single undamaged sublayer above (or on top of) a damaged sublayer, or a single undamaged sublayer below a damaged sublayer.

In some examples, N− bulk layer 1220 may include crystal damage 1232, which may be configured to limit the injection of charge carriers, such as by providing recombination centers for charge carriers. The level of crystal damage in the N− bulk layer generally will be less than the level of crystal damage in the N buffer layer and the N+ substrate layer. In some examples, the level of crystal damage may be measured by the density of recombination centers provided by the crystal damage, as measured in units of recombination centers per unit volume, as compared or relative to the density of recombination centers provided by crystal damage in one or more other layers. The concentration of doping atoms in the layers of diode 1210 may be less, more, and/or the same as the concentration of doping atoms in the corresponding layers of diode 1110.

In some examples, N− bulk layer 1220 may include damaged sublayer(s) and undamaged sublayer(s) and those damaged and undamaged sublayers may be oriented and/or positioned within N− bulk layer 1220 in any suitable ways. For example, N− bulk layer 1220 may include a single damaged sublayer sandwiched (or disposed) between undamaged sublayers. In other examples, the N− bulk layer may include a single undamaged sublayer above (or on top of) a damaged sublayer, or a single undamaged sublayer below a damaged sublayer.

In some examples, diode 1110 may include crystal damage from a particular layer until the cathode electrode (or anode assembly or anode electrode). For example, N buffer layer 1222 may include a single undamaged sublayer 1226 above a single damaged sublayer 1224 and N+ substrate layer 1218 may include crystal damage throughout the layer. In that example, crystal damage occurs from the damaged sublayer of the N buffer layer through the N+ substrate layer until the cathode electrode (e.g., the "damaged region"). The undamaged sublayer and the N− bulk layer may be referred to as the "undamaged region." Alternatively, N− bulk layer 1220 may include an undamaged layer above a damaged layer and the N buffer and N+ substrate layers may include crystal damage throughout those layers. In that example, crystal damage occurs from the damaged sublayer of the N− bulk layer through the N buffer and N+ substrate layers until the cathode electrode (e.g., the "damaged region"). The undamaged sublayer may be referred to as the "undamaged region."

Cathode assembly 1212 may include any suitable combination of layers with crystal damage configured to limit the injection of charge carriers. For example, in some examples, only the N buffer layer may include the crystal damage. In other examples, only the N− bulk layer and the N buffer layer include the crystal damage. Other combinations are possible and are included in the present disclosure.

Figure 22:
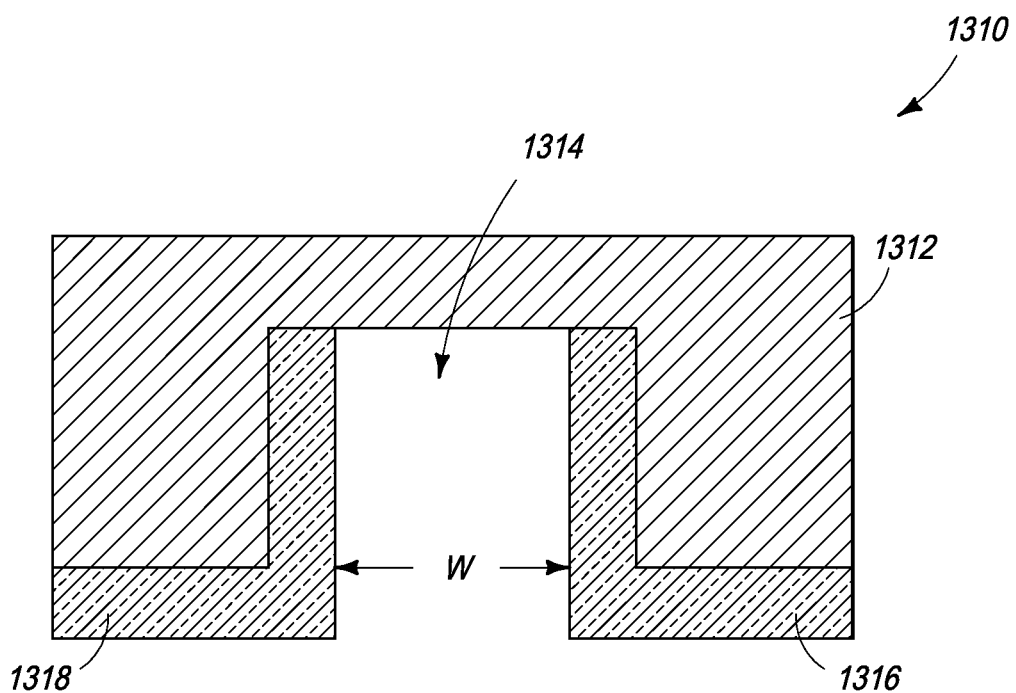
FIG. 22 is a schematic sectional view of another example of the diode of FIG. 1.

FIG. 22 is a schematic sectional view of another example of anode assembly 4, which is generally indicated at 1310. Anode assembly 1310 may sometimes be referred to having a "trench MOS Schottky barrier structure." The node assembly may be connected to a N− bulk layer, such as N− bulk layer 20 or 120, and may include an anode electrode 1312, trench(es) 1314, and insulating layers 1316 and 1318. Trench(es) 1314 may have any suitable shape(s), such as rectangular, circular, etc. Additionally, trench(es) 1314 may include any suitable width W. Anode electrode 1312 may form a Schottky rectifying contact with trench(es) 1314.

Figure 23:
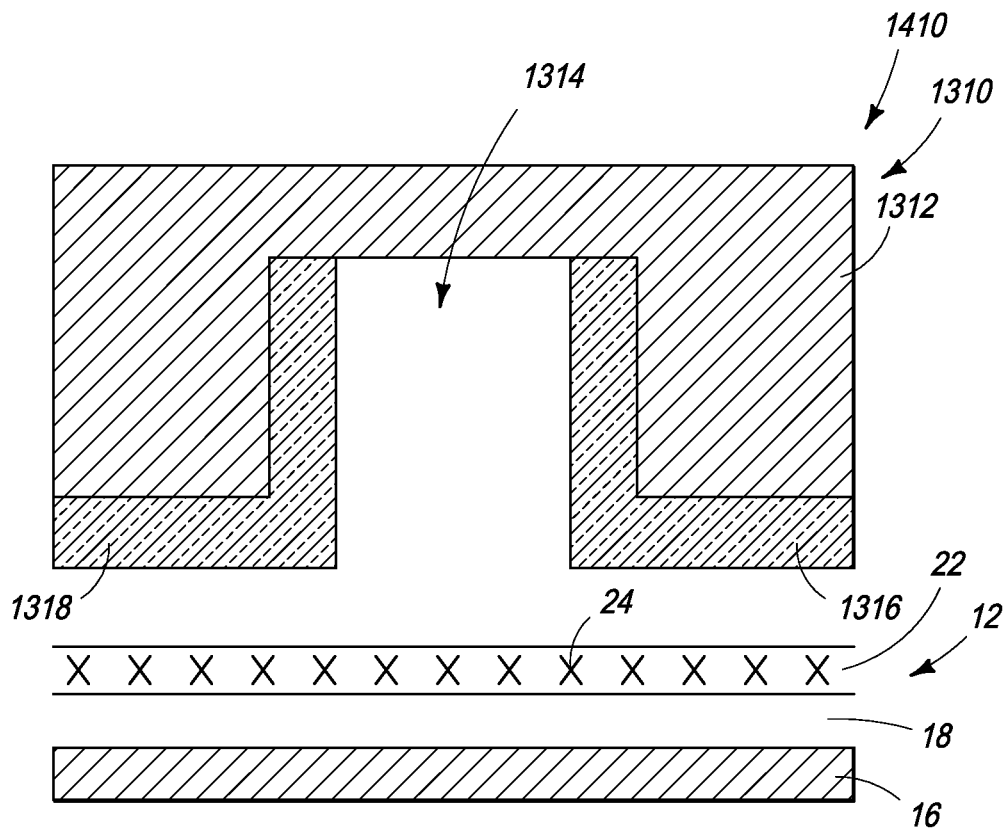
FIG. 23 is a schematic sectional view of a further example of the diode of FIG. 1.

Anode assembly 1310 may be combined with any suitable cathode assemblies described in the present disclosure. For example, anode assembly 1310 may be combined with cathode assembly 1122 in FIG. 20 or cathode assembly 1222 in FIG. 21. Alternatively, anode assembly 1310 may be combined with cathode assembly 12 to form diode 1410 shown schematically in FIG. 23.

Figure 24:
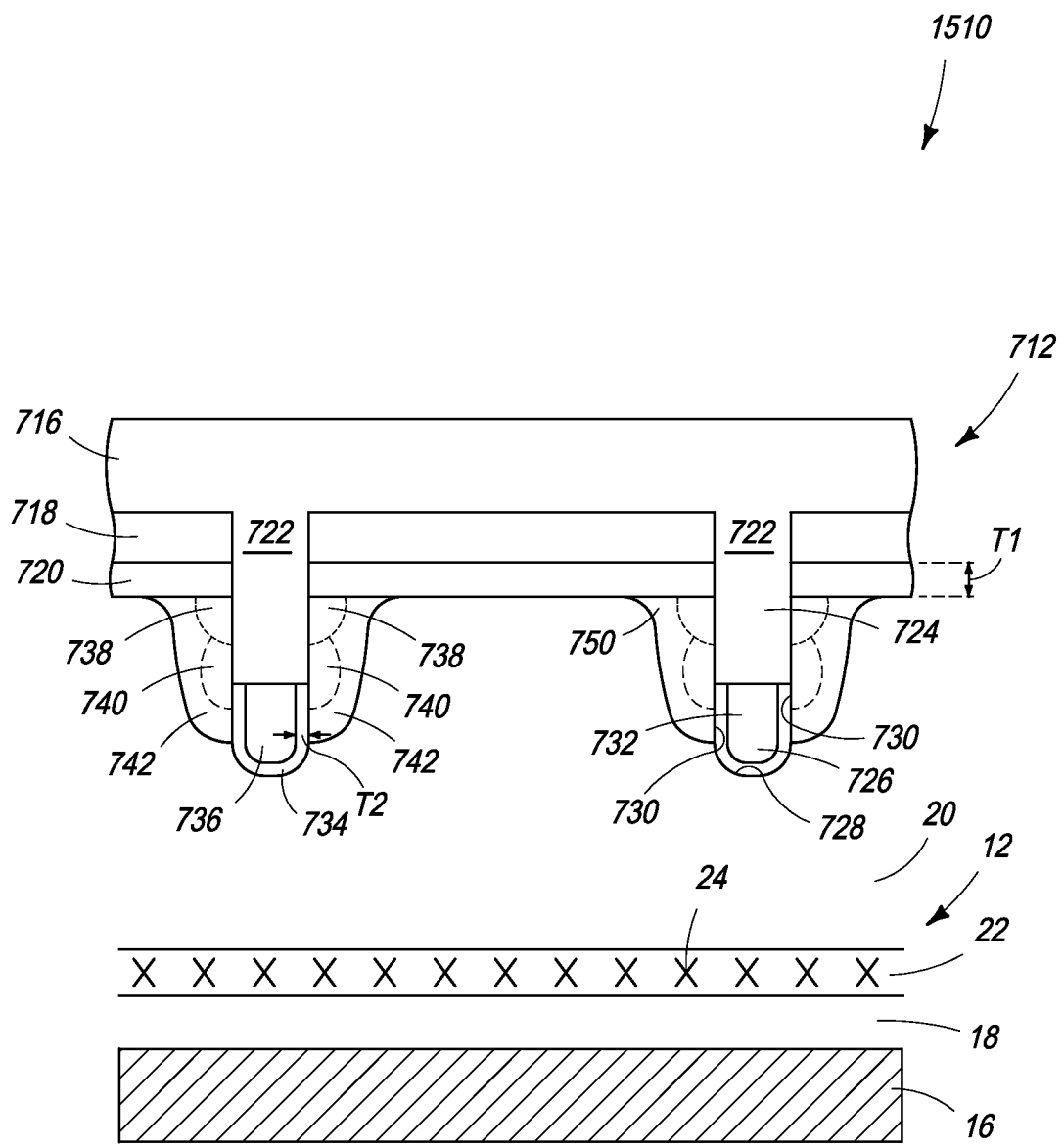
FIG. 24 is a schematic sectional view of another example of the diode of FIG. 1.

Although the drawings schematically show diodes with particular combinations of anode and cathode assemblies, the present disclosure includes all suitable combinations of anode and cathode assemblies. For example, FIG. 24 shows a combination of anode assembly 712 (FIG. 9) and cathode assembly 12 (FIG. 2) to form diode 1510 shown schematically in FIG. 24.

The disclosure set forth above may encompass multiple distinct inventions with independent utility. Although each of these inventions has been disclosed in its preferred form(s), the specific embodiments thereof as disclosed and illustrated herein are not to be considered in a limiting sense, because numerous variations are possible. The subject matter of the inventions includes all novel and nonobvious combinations and subcombinations of the various elements, features, functions, and/or properties disclosed herein. The following claims particularly point out certain combinations and subcombinations regarded as novel and nonobvious. Inventions embodied in other combinations and subcombinations of features, functions, elements, and/or properties may be claimed in applications claiming priority from this or a related application. Such claims, whether directed to a different invention or to the same invention, and whether broader, narrower, equal, or different in scope to the original claims, also are regarded as included within the subject matter of the inventions of the present disclosure.

What is claimed is:

1. A diode, comprising:
   a cathode assembly including:
      a cathode electrode,
      a N+ substrate layer on the cathode electrode,
      a N buffer layer on the N+ substrate layer, and
      a N− bulk layer on the N buffer layer, wherein the N buffer layer is disposed between the N+ substrate layer and the N− bulk layer, and the N buffer layer includes at least one damaged sublayer having crystal damage configured to provide recombination centers for charge carriers and at least one undamaged sublayer; and
   an anode assembly adjacent to the N− bulk layer.

2. The diode of claim 1, wherein the at least one damaged sublayer is disposed between the N+ substrate layer and the at least one undamaged sublayer.

3. The diode of claim 1, wherein the at least one undamaged sublayer includes first and second undamaged sublayers, and the at least one damaged sublayer is disposed between the first and second undamaged sublayers.

4. The diode of claim 1, wherein the N+ substrate layer includes crystal damage configured to provide recombination centers for charge carriers.

5. The diode of claim 1, wherein the N− bulk layer includes crystal damage configured to provide recombination centers for charge carriers, the density of recombination centers provided by the crystal damage in the N− bulk layer being less than the density of recombination centers provided by the crystal damage in the N buffer layer.

6. The diode of claim 1, wherein the anode assembly includes an anode electrode and one or more P+ regions under the anode electrode.

7. The diode of claim 6, wherein the anode assembly further includes a P layer under the anode electrode.

8. The diode of claim 1, wherein the anode assembly includes an anode electrode with at least one trench, the at least one trench includes first and second sides and a bottom, and the first and second sides include first and second insulating layers.

9. A diode, comprising:
   a cathode assembly including:
      a cathode electrode,
      a N+ substrate layer on the cathode electrode,
      a N buffer layer on the N+ substrate layer, and
      a N− bulk layer on the N buffer layer, wherein the N buffer layer is disposed between the N+ substrate layer and the N− bulk layer, and the N buffer layer includes crystal damage configured to provide recombination centers for charge carriers; and
   an anode assembly adjacent to the N− bulk layer, the anode assembly including an anode electrode with at least one trench, the at least one trench includes first and second sides and a bottom, and the first and second sides include first and second insulating layers.

10. The diode of claim 9, wherein the N buffer layer includes at least one damaged sublayer having at least a substantial portion of the crystal damage and at least one undamaged sublayer.

11. The diode of claim 10, wherein the at least one damaged sublayer is disposed between the N+ substrate layer and the at least one undamaged sublayer.

12. The diode of claim 10, wherein the at least one undamaged sublayer includes first and second undamaged sublayers, and the at least one damaged sublayer is disposed between the first and second undamaged sublayers.

13. The diode of claim 10, wherein the N+ substrate layer includes crystal damage configured to provide recombination centers for charge carriers.

14. The diode of claim 10, wherein the N− bulk layer includes crystal damage configured to provide recombination centers for charge carriers, the density of recombination centers provided by the crystal damage in the N− bulk layer being less than the density of recombination centers provided by the crystal damage in the N buffer layer.

15. A diode, comprising:
   a cathode assembly including:
      a cathode electrode,
      a N+ substrate layer on the cathode electrode,
      a N buffer layer on the N+ substrate layer, and
      a N− bulk layer on the N buffer layer, wherein the N buffer layer is disposed between the N+ substrate layer and the N− bulk layer, and the N buffer layer includes crystal damage configured to provide recombination centers for charge carriers; and
   an anode assembly including:
      an anode electrode,
      a gate electrode layer under the anode electrode, the gate electrode layer being shorted to the anode electrode,
      a gate oxide layer under the gate electrode layer,
      at least one P− body region under the gate oxide layer, and
      at least one trench that extends through the gate electrode layer, the gate oxide layer, and the at least one P− body region to the N− bulk layer, wherein the at least one trench includes an upper portion and a lower portion, the lower portion having a bottom and a plurality of sidewalls defining a bottom volume, the bottom and the plurality of sidewalls having an insulating layer, the lower portion further having a conductive material that is disposed within the bottom volume and that is in electrical communication with the anode electrode, the insulating layer being configured to electrically insulate the conductive material from the N− bulk layer, and wherein the anode electrode extends through the upper portion of the at least one trench to the conductive material,
   wherein the N buffer layer includes at least one damaged sublayer having at least a substantial portion of the crystal damage and at least one undamaged sublayer.

* * * * *